US012672415B2

(12) United States Patent
Park et al.

(10) Patent No.: US 12,672,415 B2
(45) Date of Patent: Jun. 30, 2026

(54) MULTI-WAVELENGTH LIGHT-EMITTING DEVICE AND METHOD OF MANUFACTURING THE SAME

(71) Applicant: SAMSUNG DISPLAY CO., LTD., Yongin-si (KR)

(72) Inventors: Jinjoo Park, Suwon-si (KR); Joosung Kim, Suwon-si (KR); Younghwan Park, Suwon-si (KR); Dongchul Shin, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 369 days.

(21) Appl. No.: 18/214,736

(22) Filed: Jun. 27, 2023

(65) Prior Publication Data

US 2024/0072100 A1 Feb. 29, 2024

(30) Foreign Application Priority Data

Aug. 30, 2022 (KR) ........................ 10-2022-0109268

(51) Int. Cl.
H10H 29/10 (2025.01)
H10H 29/14 (2025.01)

(52) U.S. Cl.
CPC ................................ H10H 29/142 (2025.01)

(58) Field of Classification Search
CPC .... H10H 29/142; H10H 20/01; H10H 20/815; H10H 20/813; H10H 20/0137; H10H 20/8215; H10H 20/01335; H10H 20/81; H10H 20/032; H10H 20/812; H10H 20/825; H10H 20/83; H10H 20/84; H01L 25/0753
See application file for complete search history.

(56) References Cited

U.S. PATENT DOCUMENTS

| | | | |
|---|---|---|---|
| 10,497,828 B2 | 12/2019 | Sakong et al. | |
| 2009/0001416 A1 | 1/2009 | Chua et al. | |
| 2020/0152841 A1 | 5/2020 | Han et al. | |
| 2020/0227255 A1 | 7/2020 | Zhu et al. | |

(Continued)

FOREIGN PATENT DOCUMENTS

| | | |
|---|---|---|
| KR | 10-2023-0000902 A | 1/2023 |
| WO | 2021/148813 A1 | 7/2021 |
| WO | 2022/029436 A1 | 2/2022 |

OTHER PUBLICATIONS

Stacia Keller et al., "Patterned III-Nitrides on Porous GaN: Extending Elastic Relaxation from the Nano- to the Micrometer Scale," Phys. Status Solidi RRL, 2021, 30 pages.

(Continued)

*Primary Examiner* — Samuel Park
(74) *Attorney, Agent, or Firm* — Sughrue Mion, PLLC

(57) ABSTRACT

A multi-wavelength light-emitting device configured to emit light of a first wavelength, light of a second wavelength, and a third wavelength, includes a substrate, a first type semiconductor layer provided on the substrate, an active layer provided on the first type semiconductor layer, a second type semiconductor layer provided on the active layer, and an electrode provided on the second type semiconductor layer. The active layer includes a first active area configured to emit the light of the first wavelength, a second active area configured to emit the light of the second wavelength, and a third active area configured to emit the light of the third wavelength.

12 Claims, 25 Drawing Sheets

(56) References Cited

U.S. PATENT DOCUMENTS

| | | | |
|---|---|---|---|
| 2021/0057601 A1 | 2/2021 | Oliver et al. | |
| 2021/0057607 A1* | 2/2021 | Lin | H10H 20/8162 |
| 2022/0208848 A1* | 6/2022 | Tan | H10H 20/821 |
| 2022/0416120 A1 | 12/2022 | Kim et al. | |
| 2024/0063340 A1* | 2/2024 | Keller | H10H 29/142 |

OTHER PUBLICATIONS

Fabien C.-P. Massabuau et al., "Dislocations as channels for the fabrication of sub-surface porous GaN by electrochemical etching," APL Materials, Mar. 25, 2020, 6 pages.

Kazumasa Hiramatsu et al., "Fabrication and characterization of low defect density GaN using facet-controlled epitaxial lateral overgrowth (FACELO)," Journal of Crystal Growth, vol. 221, Issues 1-4, Dec. 2000, pp. 316-326.

R. Nagarajan et al., "p-type conductivity in CuCr1—xMgχO2 films and powders," J. Appl. Phys., vol. 89, No. 12, Jun. 2001, 5 pages.

Shubhra S. Pasayat et al., "Study of Pore Geometry and Dislocations in Porous GaN Based Pseudo-Substrates Using TEM," IEEE Journal of Quantum Electronics, vol. 58, No. 4, Aug. 2022, 7 pages.

P H Griffin et al., "Porous nitride semiconductors reviewed," Journal of Physics D: Applied Physics, 53, Jul. 2, 2020, 19 pages, DOI 10.1088/1361-6463/ab9570.

Eduard Monaico et al., "Porous semiconductor compounds," Semicond. Sci. Technol., 2020, 100 pages, https://doi.org/10.1088/1361-6641/ab9477.

Zhiya Dang et al., "Silicon-based photonic crystals fabricated using proton beam writing combined with electrochemical etching method," Nanoscale Research Letters, 2012, 7 pages, http://www.nanoscalereslett.com/content/7/1/416.

I. M. Tiginyanu et al., "Surface-charge lithography for GaN microstructuring based on photoelectrochemical etching techniques," Applied Physics Letters, vol. 86, Issue 174102, Apr. 21, 2005, 4 pages, DOI: 10.1063/1.1919393.

Communication issued Jan. 31, 2024 by the European Patent Office in European Patent Application No. 23184735.1.

Hwang et al., "Development of InGaN-based red LED grown on (0001) polar surface", Applied Physics Express, 7, 071003, 2014, pp. 1-4 (5 pages total).

Iida et al., "633-nm InGaN-based red LEDs grown on thick underlying GaN layers with reduced in-plane residual stress", Appl. Phys. Lett., 116, 162101, 2020, pp. 1-5 (6 pages total).

Iida et al., "Demonstration of low forward voltage InGaN-based red LEDs", Applied Physics Express, 13, 031001, 2020, pp. 1-4 (5 pages total).

Pasayat et al.., "Compliant Micron-Sized Patterned InGaN Pseudo-Substrates Utilizing Porous GaN", Materials, 13, 213, 2020, pp. 1-10 (10 pages total).

Pasayat et al., "Growth of strain-relaxed InGaN on micrometersized patterned compliant GaN pseudo-substrates", Appl. Phys. Lett., 116, 111101, 2020, pp. 1-5 (6 pages total).

Miao et al., "GaN Overgrowth on Thermally Etched Nanoporous GaN Template", Japanese Journal of Applied Physics, 52, 2013, 08JB03, pp. 1-4 (5 pages total).

* cited by examiner

MULTI-WAVELENGTH LIGHT-EMITTING DEVICE AND METHOD OF MANUFACTURING THE SAME

CROSS-REFERENCE TO RELATED APPLICATION

This application is based on and claims priority under 35 U.S.C. § 119 to Korean Patent Application No. 10-2022-0109268, filed on Aug. 30, 2022, in the Korean Intellectual Property Office, the disclosure of which is incorporated by reference herein in its entirety.

BACKGROUND

1. Field

The present disclosure relates to a multi-wavelength light-emitting device configured to emit light of a plurality of colors, and a method of manufacturing the multi-wavelength light-emitting device.

2. Description of Related Art

Liquid crystal displays (LCD) and organic light-emitting diode (OLED) displays have been widely used as display devices. In addition, a technology for manufacturing a high-resolution display device using a micro light-emitting diode (micro LED) has been in the spotlight. Light-emitting diodes (LEDs) have advantages of lower power consumption and eco-friendliness. Due to these advantages, industrial demand has increased.

In general, in order to implement a color image, a color conversion layer that convert blue light emitted from an emission layer is necessary, and thus, the volume of a display device has increased and the manufacturing step of the display device has become complicated.

In particular, micro-LED displays have expanded rapidly due to their outstanding characteristics, such as low power consumption, nanosecond response time, long lifespan, and wide color space. To obtain a full color micro-LED display, the most commonly used method is to grow red, green, and blue micro LEDs on different wafers and then assemble them on the same thin-film transistor (TFT). However, because precise alignment for each pixel is required, the transfer or assembly process is currently identified as a problem in commercialization, as it limits resolution, lowers production efficiency, and increases production cost.

An approach to avoid the issues identified above is monolithic integration, where RGB micro-LEDs are manufactured on the same substrate. In particular, as micro-LED chip size reduction and resolution increase are required, monolithic multi-color manufacturing technology may be utilized. However, there is a problem in that the manufacturing process is complicated because the micro-LED growth conditions for each R/G/B are different.

SUMMARY

One or more embodiments provide a multi-wavelength light-emitting device configured to emit light of a plurality of colors.

In addition, one or more embodiments provide a method of monolithically manufacturing a multi-wavelength light-emitting device that may emit light of a plurality of colors.

Additional aspects will be set forth in part in the description which follows and, in part, will be apparent from the description, or may be learned by practice of the presented embodiments.

According to an aspect of an example embodiment, a multi-wavelength light-emitting device configured to emit light of a first wavelength, light of a second wavelength, and a third wavelength, includes: a substrate; a first type semiconductor layer provided on the substrate; an active layer provided on the first type semiconductor layer; a second type semiconductor layer provided on the active layer; and an electrode provided on the second type semiconductor layer, wherein the active layer includes: a first active area configured to emit the light of the first wavelength; a second active area configured to emit the light of the second wavelength; and a third active area configured to emit the light of the third wavelength, wherein the first type semiconductor layer includes: a first area corresponding to the first active area; a second area corresponding to the second active area; and a third area corresponding to the third active area, wherein the first area of the first type semiconductor layer includes a first nanopore, the second area of the first type semiconductor layer includes a second nanopore, and a first porosity of the first area of the first type semiconductor layer is different from a second porosity of the second area of the first type semiconductor layer.

The first porosity may be greater than the second porosity, the light of the first wavelength may include red light, and the light of the second wavelength may include green light.

The first porosity may be adjusted by at least one of a size and a density of the first nanopore, and the second porosity may be adjusted by at least one of a size and a density of the second nanopore.

The first porosity may be in a range of about 20% to about 70%.

A diameter of the first nanopore may be in a range of about 30 nm to about 200 nm.

The first type semiconductor layer may include an n-type gallium nitride (GaN), and the second type semiconductor layer may include a p-type GaN.

The active layer may include indium gallium nitride (InGaN) or aluminum indium gallium nitride (AlInGaN).

The multi-wavelength light-emitting device may further include an un-gallium nitride (u-GaN) layer or an un-indium gallium nitride (u-InGaN) layer provided between the substrate and the first type semiconductor layer.

The multi-wavelength light-emitting device may further include an un-gallium nitride (u-GaN) layer or an un-indium gallium nitride (u-InGaN) layer provided between the first type semiconductor layer and the active layer.

The multi-wavelength light-emitting device may further include a first current blocking layer provided between the first active area and the second active area and between the first area of the first type semiconductor layer and the second area of the first type semiconductor layer, and a second current blocking layer provided between the second active area and the third active area and between the second area of the first type semiconductor layer and the third area of the first type semiconductor layer.

A mask may be further provided between the substrate and the first type semiconductor layer, and the mask may include: a first pattern configured to open the first area of the first type semiconductor layer; a second pattern configured to partially open the second area of the first type semiconductor layer; and a third pattern configured to partially open the third area of the first type semiconductor layer.

The multi-wavelength light-emitting device may further include a driving layer electrically connected to the electrode and configured to drive the active layer.

According to an aspect of an example embodiment, a method of manufacturing a multi-wavelength light-emitting device including a first sub-pixel configured to emit light of a first wavelength, a second sub-pixel configured to emit light of a second wavelength, and a third sub-pixel configured to emit light of a third wavelength, include: depositing a first type semiconductor layer on a substrate; forming a first nanopore having a first porosity in a first area of the first type semiconductor layer corresponding to the first sub-pixel; forming a second nanopore having a second porosity in a second area of the first type semiconductor layer corresponding to the second sub-pixel, the second porosity being different from the first porosity; depositing an active layer on the first type semiconductor layer; forming a second type semiconductor layer on the active layer; and forming an electrode on the second type semiconductor layer.

The forming the first nanopore and the second nanopore may include forming the first nanopore and the second nanopore by an electrochemical wet etching method using a mask that sequentially opens the first area and the second area over time.

The forming the first nanopore and the second nanopore may include forming the first nanopore and the second nanopore by an electrochemical wet etching method using a mask that opens the first area and partially opens the second area.

The method may further include, prior to the forming the first type semiconductor layer, forming a mask configured to open the first area of the first type semiconductor layer, open the second area of the first type semiconductor layer to have a first open rate, and open a third area of the first type semiconductor layer corresponding to the third sub-pixel to have a second open rate that may be less than the first open rate.

the forming the first nanopore may include: arranging a first mask on the first type semiconductor layer, the first mask configured to open the first area of the first type semiconductor layer and close the second area of the first type semiconductor layer and a third area of the first type semiconductor layer; and forming the first nanopore in the first area of the first type semiconductor layer by an electrochemical wet etching method using the first mask.

The forming the second nanopore may include: after removing the first mask, arranging a second mask on the first type semiconductor layer, the second mask being configured to close the first area of the first type semiconductor layer and the third area of the first type semiconductor layer, and open the second area of the first type semiconductor layer; and forming the second nanopore in the second area of the first type semiconductor layer by an electrochemical etching method using the second mask.

The forming the first nanopore and the second nanopore may include forming the first nanopore and the second nanopore by an electrochemical wet etching method using a mask configured to open the first area of the first type semiconductor layer, partially open the second area of the first type semiconductor layer, and close a third area of the first type semiconductor layer corresponding to the third sub-pixel.

The method may further include forming a first ion implantation area between the first area of the first type semiconductor layer and the second area of the first type semiconductor layer, and forming a second ion implantation area between the second area of the first type semiconductor layer and a third area of the first type semiconductor layer.

The method may further include forming a first current blocking layer between the first sub-pixel and the second sub-pixel, and forming a second current blocking layer between the second sub-pixel and the third sub-pixel.

The first porosity may be greater than the second porosity, the light of the first wavelength may include red light, and the light of the second wavelength may include green light.

the first porosity may be adjusted by at least one of a size and a density of the first nanopore, and the second porosity may be adjusted by at least one of a size and a density of the second nanopore.

The first porosity may be in a range of about 20% to about 70%.

A diameter of the first nanopore may be in a range of about 30 nm to about 200 nm.

The first type semiconductor layer may include an n-type gallium nitride (GaN), and the second type semiconductor layer may include a p-type GaN.

The active layer may include indium gallium nitride (InGaN) or aluminum indium gallium nitride (AlInGaN).

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
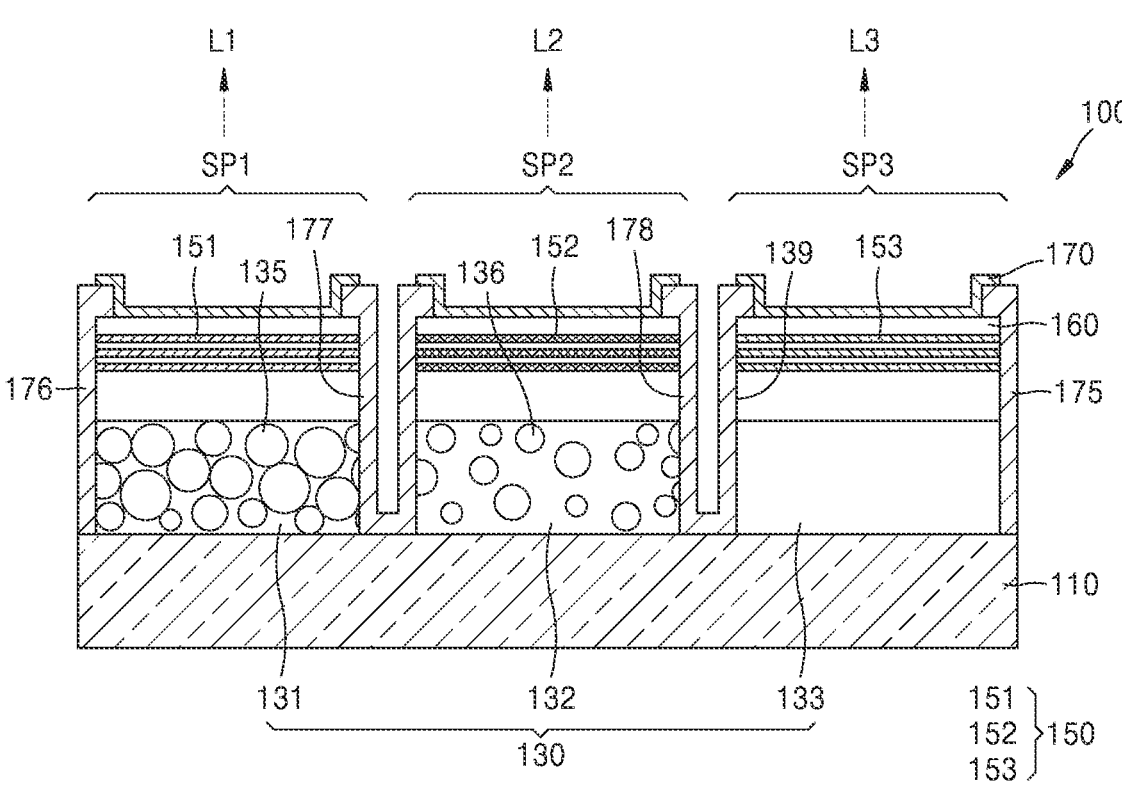
FIG. 1 is a diagram illustrating a multi-wavelength light-emitting device according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of", when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Hereinafter, a multi-wavelength light-emitting device and a method of manufacturing the multi-wavelength light-emitting device, according to various embodiments are described in detail with reference to the accompanying drawings. In the drawings below, the same reference symbol denote the same element, and a size of each element may be exaggerated for clarity and convenience of description. Although the terms "first", "second", etc., may be used herein to describe various elements, areas, and/or layers, these elements, areas, and/or layers should not be limited by these terms. These terms are only used to distinguish one element from other elements.

An expression used in the singular encompasses the expression of the plural, unless it has a clearly different meaning in the context. In addition, when a portion "comprises" or "includes" an element, it may denote that the portion may further include other elements without excluding the other elements, unless specified otherwise. In addition, a size or thickness of each element in the drawings may be exaggerated for clarity of description. In addition, when it is described that a certain material layer is present on a substrate or another layer, the material layer may be present in contact with the substrate or the other layer, or another third layer may be present therebetween. In addition, in the embodiments described below, a material included in each layer is an example, and other materials may also be used.

In addition, terms, such as "-er/or" and "module", used in the specification denote a unit for processing at least one function or operation, and may be implemented in hardware, software, or a combination thereof.

Specific executions described in the present embodiment are only examples, and do not limit the technical scope in any way. For brevity of specification, descriptions of electronic elements, control systems, software, and other functional aspects of the systems according to the related art may be omitted. In addition, connections or connection members of lines between elements shown in the drawings are illustrative of functional connections and/or physical or circuit connections, and may be represented in an actual device as a variety of alternative or additional functional connections, physical connections, or circuit connections.

The use of the term "the" and similar referential terms may be used in both the singular and the plural.

Operations constituting the method may be performed in any suitable order unless explicitly stated that they must be performed in an order described. In addition, the use of all illustrative terms (for example, etc.) is merely for the purpose of describing the technical idea in detail, and the scope of rights is not limited by these terms unless limited by the claims.

FIG. 1 is a diagram illustrating a multi-wavelength light-emitting device according to an embodiment.

Referring to FIG. 1, the multi-wavelength light-emitting device 100 may include a plurality of pixels, but in FIG. 1, only one of the pixels is shown as an example, for convenience. The pixel may be a unit for displaying an image. Each of the pixels may include sub-pixels emitting light of different colors. An image may be displayed by controlling a color and light amount from each of the sub-pixels. For example, each of the pixels may include a first sub-pixel SP1 that emits light of a first wavelength L1, a second sub-pixel SP2 that emits light of a second wavelength L2, and a third sub-pixel SP3 that emits light of a third wavelength L3.

The multi-wavelength light-emitting device 100 may include a substrate 110, a first type semiconductor layer 130 provided on the substrate 110, an active layer 150 provided on the first type semiconductor layer 130, and a second type semiconductor layer 160 provided on the active layer 150.

The substrate 110 may include a silicon substrate, a glass substrate, a silicon substrate onto which silicon oxide ($SiO_2$) is coated, a gallium nitride (GaN)-based substrate, etc. However, this is only an example, and other various materials may be used for the substrate 110.

The first type semiconductor layer 130 may include an n-type semiconductor. The first type semiconductor layer 130 may include a Group III-V-based n-type semiconductor, such as n-type gallium nitride (n-GaN). The first type semiconductor layer 130 may include a layer or layers.

The active layer 150 may generate light by combination of electrons and holes. The active layer 150 may have a multi-quantum well (MQW) structure or a single-quantum well (SQW) structure. The active layer 150 may include a first active area 151 emitting the light of the first wavelength L1, a second active area 152 emitting the light of the second wavelength L2, and a third active area 153 emitting the light of the third wavelength L3. The light of the first wavelength L1 may include red light, the light of the second wavelength L2 may include green light, and the light of the third wavelength L3 may include blue light. The active layer 150 may include a GaN-based material including indium (In). The active layer 150 may include indium gallium nitride (InGaN) or aluminum indium gallium nitride (AlInGaN).

The first type semiconductor layer 130 may include a first area 131 corresponding to the first active area 151, a second area 132 corresponding to the second active area 152, and a third area 133 corresponding to the third active area 153. The first area 131 may include a first nanopore 135, and the second area 132 may include a second nanopore 136. The first area 131 may be configured to have a first porosity by the first nanopore 135, and the second area 132 may be configured to have a second porosity by the second nanopore 136. The first porosity indicates a percentage of (V1/V2), when a total volume of the first nanopore 135 is V1 and a total volume of the first area 131 is V2. The second porosity indicates a percentage of (V3/V4), when a total volume of the second nanopore 136 is V3 and a total volume of the second area 132 is V4. The first porosity may be different from the second porosity. The first porosity may be greater than the second porosity. For example, the first porosity may be in a range of about 20% to about 70%. The first porosity may be in a range of about 20% to about 60%. The third area 133 may not include a porous material. In other words, a porosity of the third area 133 may be substantially zero. The first porosity may be adjusted by at least one of a size and a density of the first nanopore 135, and the second porosity may be adjusted by at least one of a size and a density of the second nanopore 136. The first nanopore 135 may have a diameter in a range of 30 nm to 200 nm. Here, the diameter may indicate a maximum diameter. The second nanopore 136 may have a diameter in the range of about 30 nm to about 200 nm.

Depending on the porosity of the first area 131, the second area 132, and the third area 133, strain in each area may vary. By adjusting the porosity of each of the areas, strain of the first type semiconductor layer 130 may be locally controlled. Because the strain of each of the first area 131, the second area 132, and the third area 133 are different from one another, a material composition ratio or material content of the active layer 150 grown in the first area 131, the second area 132, and the third area 133 may vary. For example, In content of the first active area 151, the second active area 152, and the third active area 153 may vary, and a wavelength of light emitted from each of the active areas may vary depending on the In content.

For example, the second type semiconductor layer 160 may include a p-type semiconductor. The second type semiconductor layer 160 may include a Group III-V-based p-type semiconductor, such as p-type gallium nitride (p-GaN). The second type semiconductor layer 160 may include a layer or layers.

An electrode 170 may be provided on the second type semiconductor layer 160. The electrode 170 may include, for example, silver (Ag), gold (Au), aluminum (Al), chrome (Cr), nickel (Ni), or any alloys thereof. The electrode 170 may be formed of a transparent electrode or an opaque electrode. For example, the transparent electrode may include indium tin oxide (ITO), zinc oxide (ZnO), indium zinc oxide (IZO), or indium gallium zinc oxide (IGZO). When the electrode 170 is formed of the transparent electrode, the electrode 170 may be arranged to cover the second type semiconductor layer 160. When the electrode 170 is the opaque electrode, the electrode 170 may further include a window area so as to transmit light emitted from the active layer 150.

In addition, a trench 139 may be provided between the first sub-pixel SP1 and the second sub-pixel SP2 and between the second sub-pixel SP2 and the third sub-pixel SP3. The trench 139 may be formed to pass through the electrode 170, the second type semiconductor layer 160, the active layer 150, and the first type semiconductor layer 130. A current blocking layer 175 may be provided on the trench 139. The current blocking layer 175 may prevent leakage of current to other adjacent sub-pixel areas. For example, the current blocking layer 175 may include silicon oxide or silicon nitride. The current blocking layer 175 may include, for example, $SiO_2$. The multi-wavelength light-emitting device 100 may include multiple current blocking layers, including current blocking layer 176, current blocking layer 177 provided between the first active area 151 and the second active area 152, current blocking layer 178 provided between the second active area 152 and the third active area 153, and current blocking layer 175.

In the multi-wavelength light-emitting device 100, the first type semiconductor layer 130 includes a plurality of areas having different porosity from each other, such that a plurality of areas having different In content from each other may be monolithically formed on the active layer 150 grown on the first type semiconductor layer 130. Accordingly, an additional color conversion layer is not necessary.

Figure 2:
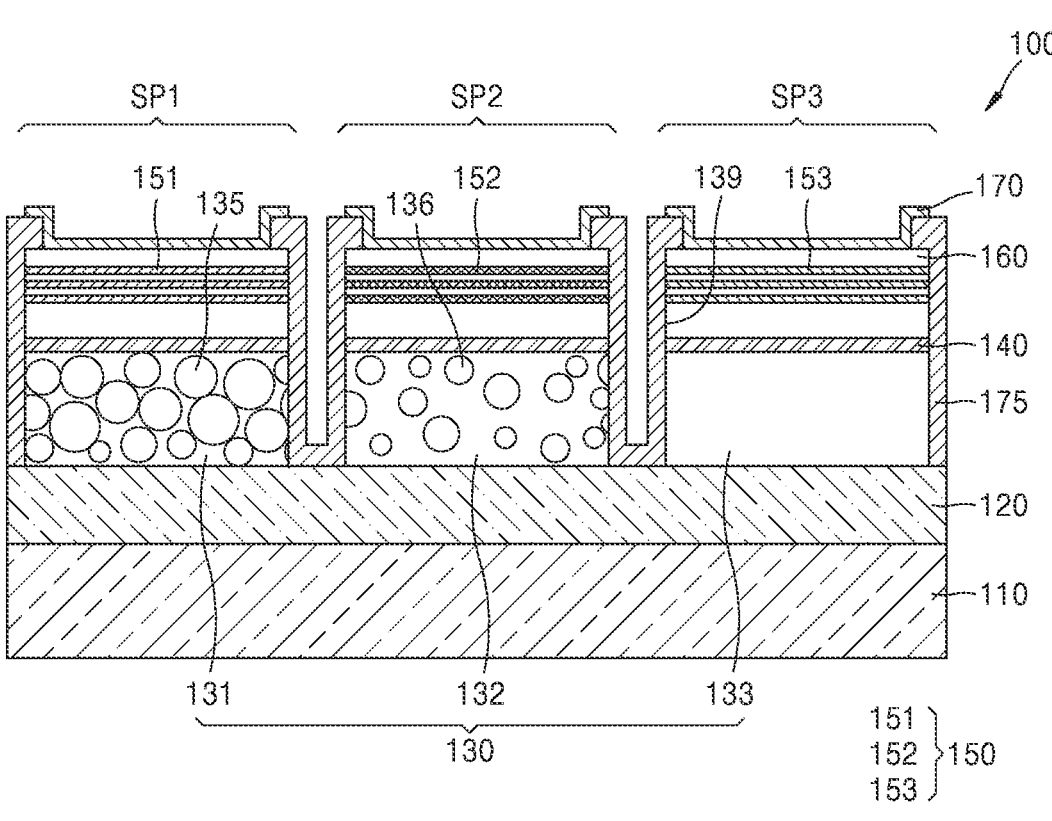
FIG. 2 is a diagram illustrating an example in which a buffer layer is further included in the multi-wavelength light-emitting device shown in FIG. 1 according to an embodiment.

FIG. 2 is a diagram illustrating an example in which a buffer layer is further included in the multi-wavelength light-emitting device 100 shown in FIG. 1 according to an embodiment.

In FIG. 2, the same reference numerals as those of FIG. 1 have substantially the same functions and configurations as those described in FIG. 1, and detailed descriptions thereof are omitted herein.

A first buffer layer 120 may be further provided between the substrate 110 and the first type semiconductor layer 130. The first buffer layer 120 may include a un-gallium nitride (u-GaN) layer or a un-indium gallium nitride (u-InGaN) layer. The first buffer layer 120 may assist the first type semiconductor layer 130 to grow well.

A second buffer layer 140 may be further provided between the first type semiconductor layer 130 and the active layer 150. The second buffer layer 140 may include a u-GaN layer or a u-InGaN layer. The second buffer layer 140 may reduce a lattice constant mismatch and assist the active layer 150 to grow well.

Figure 3:
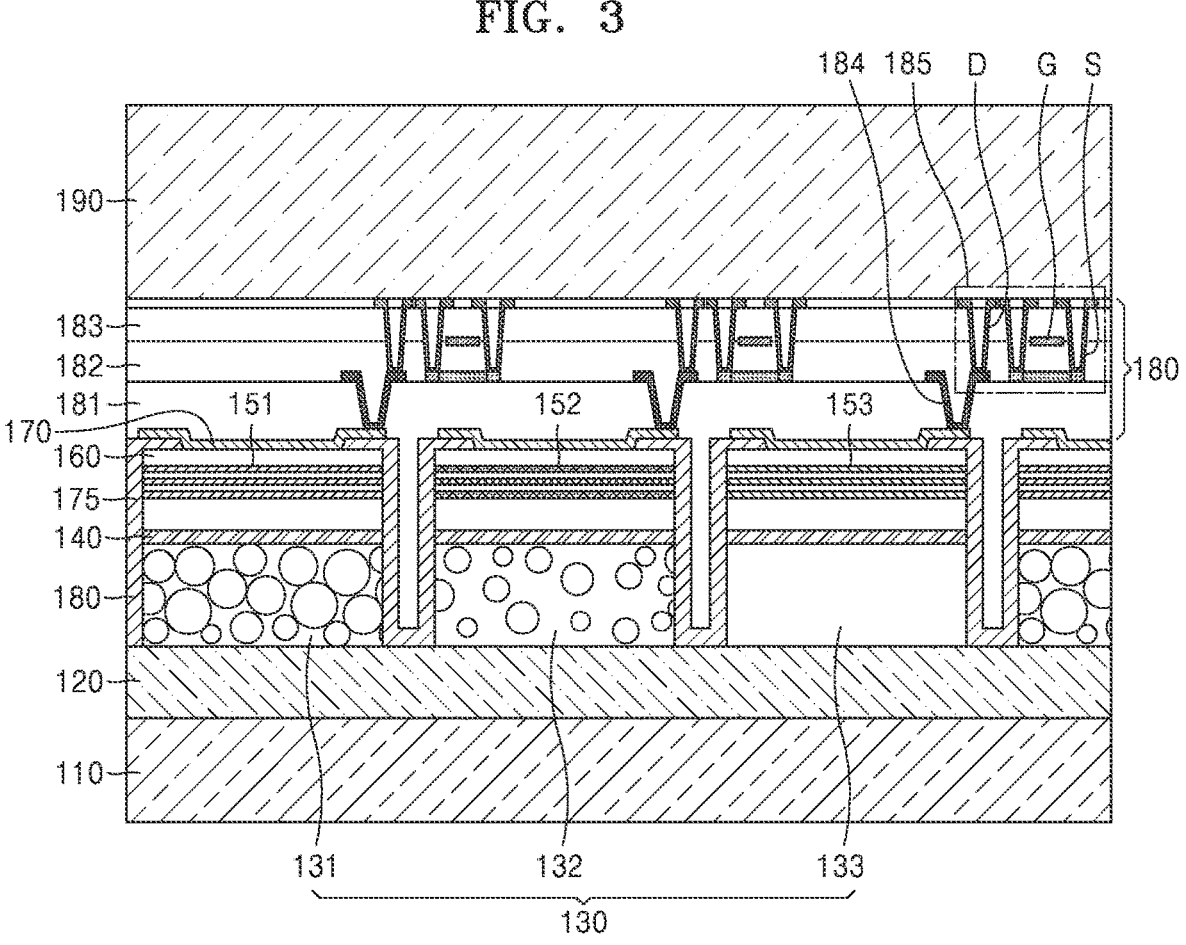
FIG. 3 is a diagram illustrating the multi-wavelength light-emitting device further including a driving layer according to an embodiment.

FIG. 3 is a diagram illustrating the multi-wavelength light-emitting device 100A further including a driving layer 180 according to an embodiment.

In FIG. 3, the same reference numerals as those of FIG. 2 have substantially the same functions and configurations as those described in FIG. 2, and detailed descriptions thereof are omitted herein.

The multi-wavelength light-emitting device 100A may include the driving layer 180 for electrically driving the active layer 150 for each sub-pixel. The driving layer 180 may include a driving element 185 for electrically driving the active layer 150 for each sub-pixel. For example, the driving element 185 may include a transistor, a thin-film transistor or a high electron mobility transistor. For example, the driving element 185 may include a gate electrode G, a source electrode S, and a drain electrode D. The driving layer 180 may further include at least one insulating layer. For example, the at least one insulating layer may include a first insulating layer 181, a second insulating layer 182, and a third insulating layer 183. A via 184 may be provided in the first insulating layer 181 such that the driving element 185 and the electrode 170 are electrically connected to each other. A cover layer 190 may be further provided on the driving layer 180. The cover layer 190 may be configured to protect the driving layer 180 from an external environment, such as oxygen and moisture.

Figure 4:
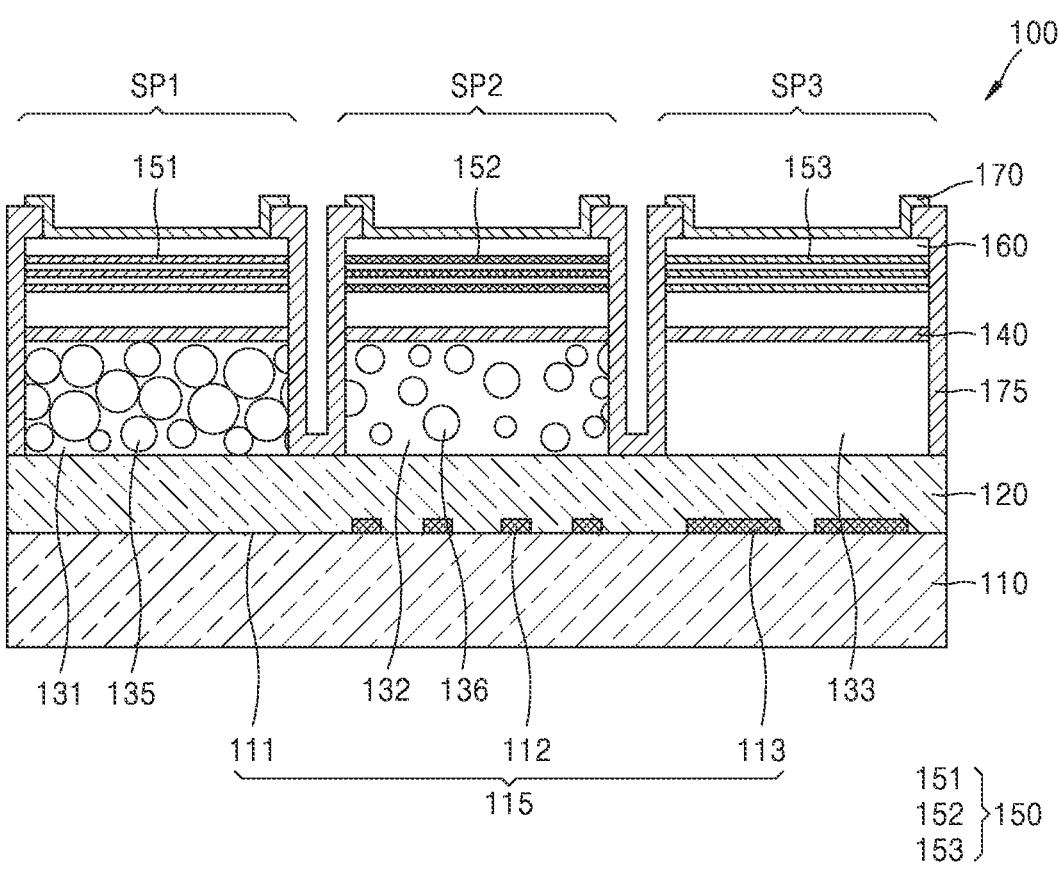
FIG. 4 is a diagram illustrating the multi-wavelength light-emitting device shown in FIG. 2, which further includes a mask, according to an embodiment.

FIG. 4 is a diagram illustrating the multi-wavelength light-emitting device 100 shown in FIG. 2, which further includes a mask 115 according to an embodiment.

The mask 115 may be further provided between the substrate 110 and the first type semiconductor layer 130. In FIG. 4, the mask 115 is provided between the substrate 110 and the first buffer layer 120.

The mask 115 may include a first pattern 111 configured to open the first area 131 of the first type semiconductor layer 130, a second pattern 112 configured to partially open the second area 132 of the first type semiconductor layer 130, and a third pattern 113 configured to partially open the third area 133 of the first type semiconductor layer 130. When an open rate of the first pattern 111 is OR1, an open rate of the second pattern 112 is OR2, and an open rate of the third pattern 113 is OR3, the mask 115 may be configured to satisfy a relationship (OR1>OR2>OR3). The open rate may indicate a ratio of an open area of the corresponding pattern to an area of the corresponding area. The mask 115 is described in greater detail later.

Next, a method of manufacturing a multi-wavelength light-emitting device, according to an embodiment is described.

FIGS. 5A, 5B, 5C, 5D, 5E and 5F are diagrams illustrating a method of manufacturing a multi-wavelength light-emitting device, according to an embodiment.

Figure 5A:
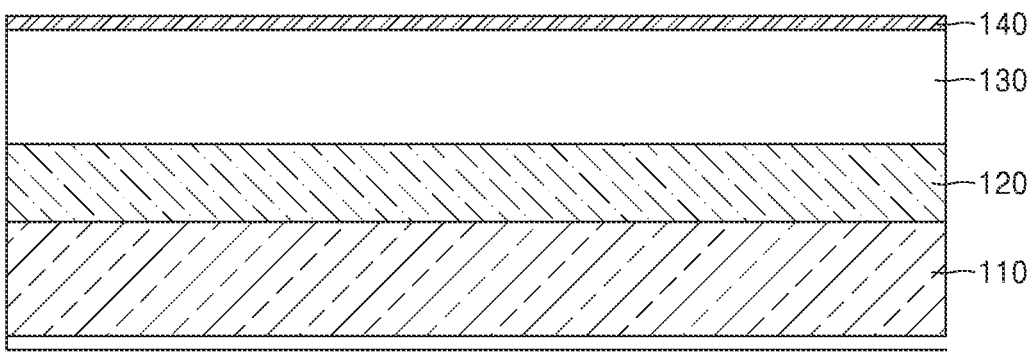
FIGS. 5A, 5B, 5C, 5D, 5E and 5F are diagrams illustrating a method of manufacturing a multi-wavelength light-emitting device, according to an embodiment.

Referring to FIG. 5A, the first type semiconductor layer 130 is deposited over the substrate 110. The first buffer layer 120 may be further deposited between the substrate 110 and the first type semiconductor layer 130. In addition, the second buffer layer 140 may be further deposited on the first type semiconductor layer 130. A deposition method may include, for example, metalorganic chemical vapor deposition (MOCVD).

Figure 5B:
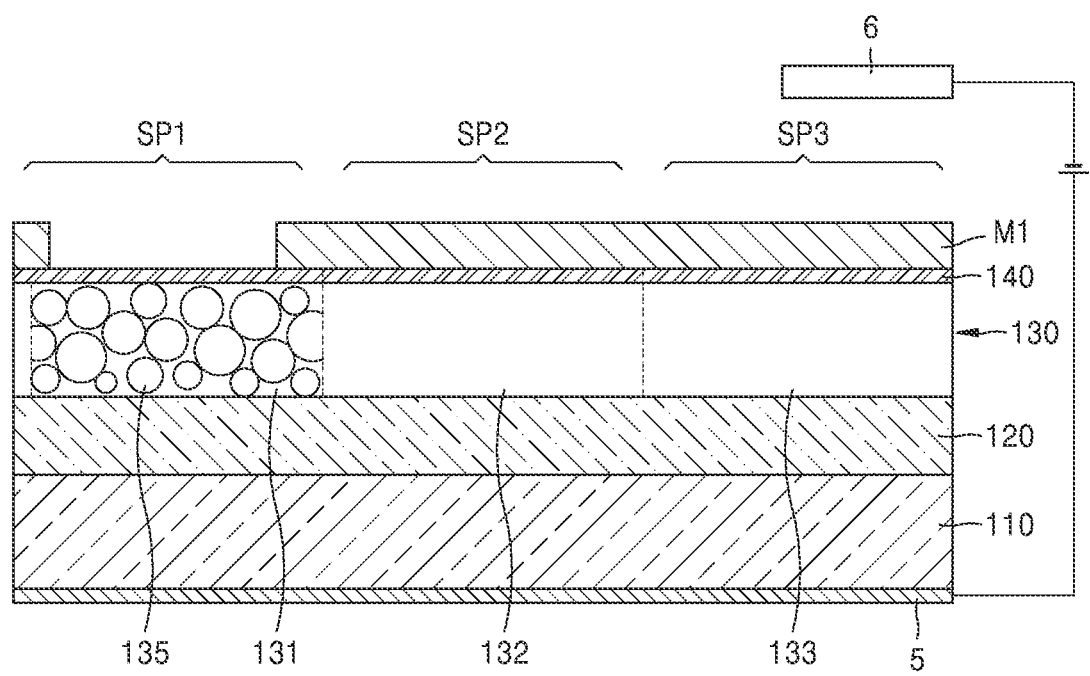

Referring to FIG. 5B, the first nanopore 135 may be formed to have the first porosity in the first area 131 corresponding to the first sub-pixel (SP1 in FIG. 1) of the first type semiconductor layer 130. A first mask M1 configured to open the first area 131 and close the second area 132 and the third area 133 may be disposed over the first type semiconductor layer 130. In addition, the first type semiconductor layer 130 may be etched using an electrochemical wet etching method. The electrochemical wet etching method may include an etching method by a potential difference or a photoelectrochemical etching method. The first nanopore 135 may be formed in the first area 131 opened by the first mask M1. An electrochemical etching device may include a first electrode 5, which is provided on the substrate 110, and a second electrode 6. For example, the second electrode 6 may include platinum.

When the first nanopore 135 is formed, pore size or pore density may be adjusted by adjusting voltage, time, electrolyte, doping concentration, etc. Accordingly, the first porosity of the first nanopore 135 may be controlled.

Figure 5C:
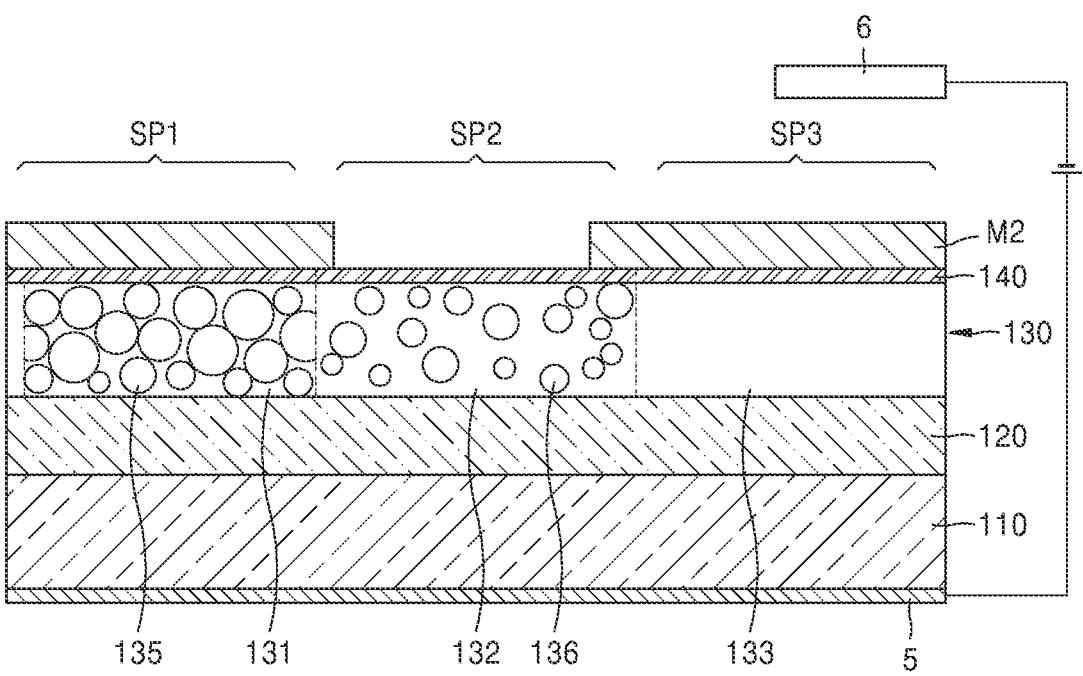

Referring to FIG. 5C, the first mask M1 may be removed, and a second mask M2 may be disposed on the first type semiconductor layer 130. The second mask M2 may be configured to open the second area 132 of the first type semiconductor layer 130 and close the first area 131 and the third area 133. The second nanopore 136 may be formed in the second area 132 by the electrochemical wet etching method using the second mask M2. When the second nanopore 136 is formed, pore size or pore density may be adjusted by adjusting voltage, time, electrolyte, doping concentration, etc. Accordingly, the second porosity of the second nanopore 136 may be controlled. The first type semiconductor layer 130 may be formed such that the first porosity is greater than the second porosity. By using a pore-free structure, the third area 133 may induce a lattice mismatch to directly affect a layer to be deposited thereon.

Figure 5D:
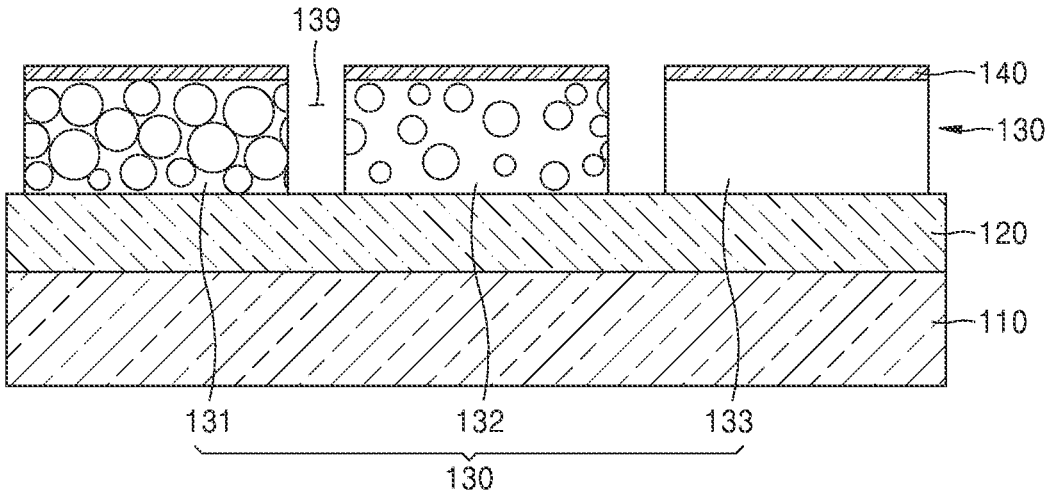

Referring to FIG. 5D, the second mask M2 may be removed, and the trench 139 may be formed between the first area 131 and the second area 132 and between the second area 132 and the third area 133. The trench 139 may be formed to pass through the second buffer layer 140 and the first type semiconductor layer 130. The trench 139 may divide a pixel into units of sub-pixels.

Figure 5E:
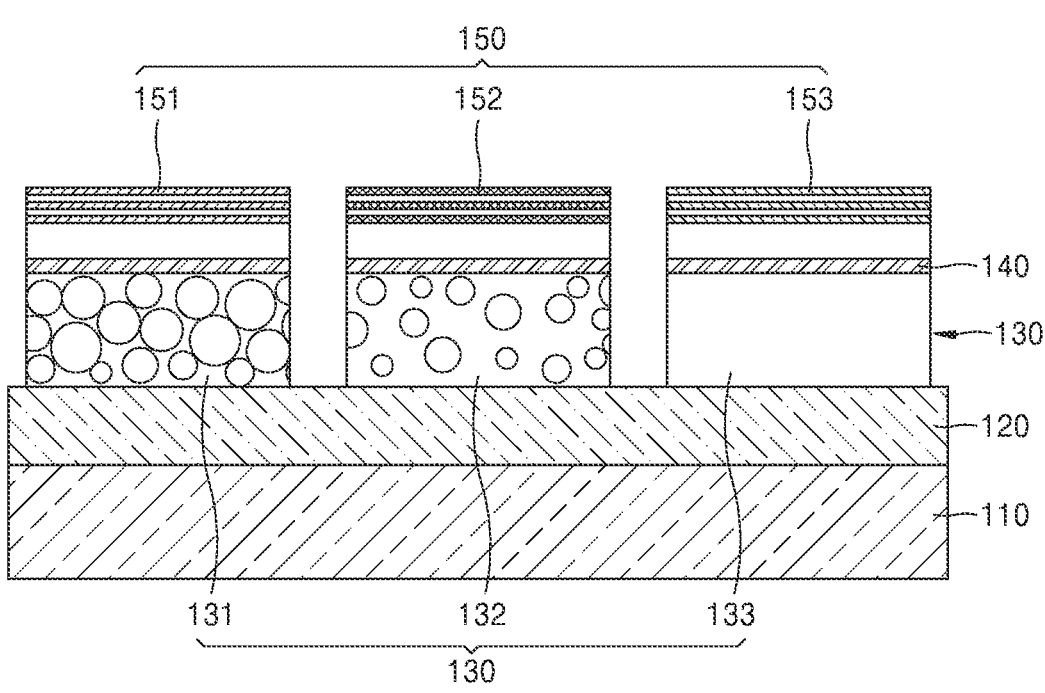

Referring to FIG. 5E, the active layer 150 may be deposited on the second buffer layer 140. Because the second buffer layer 140 has electrical insulating properties, the second buffer layer 140 may maintain a flat plate structure without being affected by etching even after the etching process. Accordingly, when the active layer 150 is grown on the second buffer layer 140, the active layer 150 may be grown without defects. The active layer 150 may include a Group III-V-based semiconductor, such as GaN. The active layer 150 may have, for example, a multi-quantum well structure, in which InGaN layers and GaN layers are alternately stacked. For example, the active layer 150 may have a multi-quantum well structure, in which AlInGaN layers and GaN layers are alternately stacked. The active layer 150 may include the first active area 151 grown in the first area 131 of the first type semiconductor layer 130, the second active area 152 grown in the second area 132, and the third active area 153 grown in the third area 133. Because the first area 131, the second area 132, and the third area 133 have different porosity from each other, strain in each of the areas may be different from one another. When the active layer 150 is grown, for example, even when the same In source is injected in the vapor phase, the In composition in the active layer 150 may vary for each area depending on the strain situation of a lower area of the active layer 150. In other words, the In composition of the first active area 151, the second active area 152, and the third active area 153 may vary, and accordingly, an emission wavelength in each of the first, second, and third active areas 151, 152, and 153 may also vary. The light of the first wavelength may be emitted from the first active area 151, the light of the second wavelength may be emitted from the second active area 152, the light of the third wavelength may be emitted from the third active area 153, and the emission wavelength may have a relationship of (first wavelength>second wavelength>third wavelength). For example, red wavelength light may be emitted from the first active area 151 grown in the first area 131 having a relatively large porosity, green wavelength light may be emitted from the second active area 152 grown in the second area 132 having a relatively small porosity, and blue wavelength light may be emitted from the third active area 153 grown in the third area 133 having the smallest porosity or no porosity.

Figure 5F:
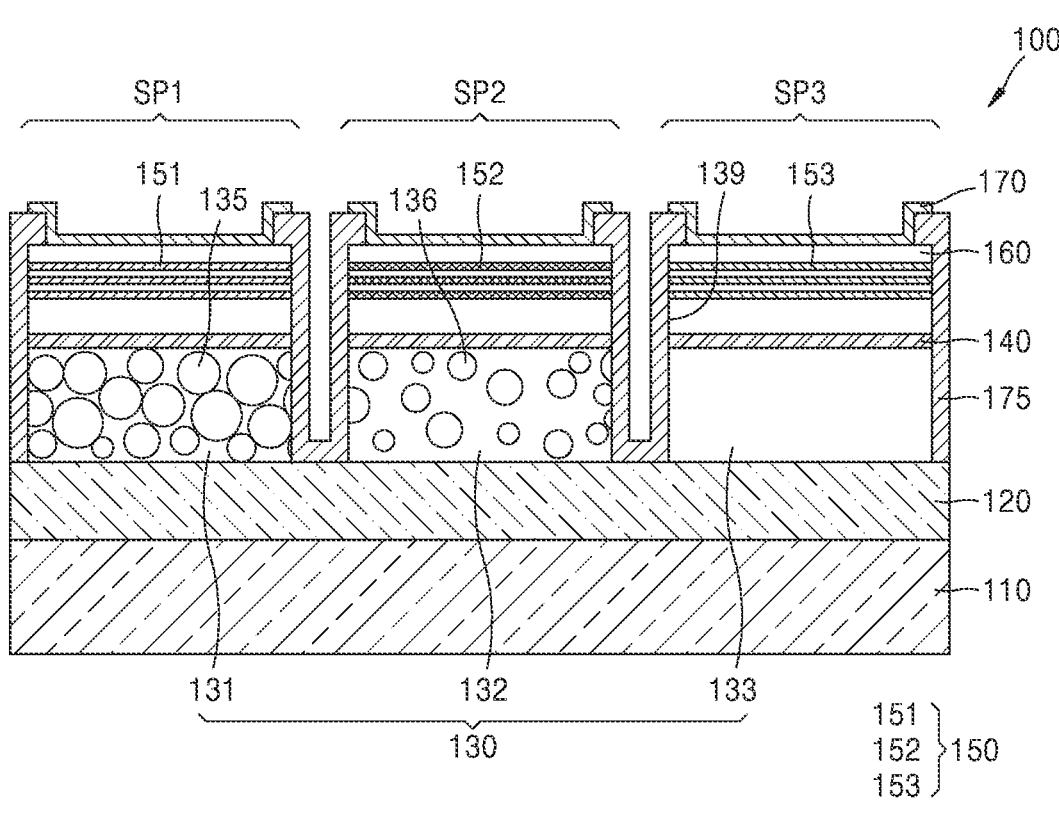

Referring to FIG. 5F, the second type semiconductor layer 160 may be deposited on the active layer 150. The current blocking layer 175 may be formed in the trench 139. The current blocking layer 175 may separate the first sub-pixel SP1, the second sub-pixel SP2, and the third sub-pixel SP3 from one another so that the multi-wavelength light-emitting device 100 may be independently driven in units of sub-pixels. In addition, the electrode 170 may be formed on the second type semiconductor layer 160. Referring to FIG. 3, the driving layer 180 may be formed on the electrode 170. As described above, in the method of manufacturing the multi-wavelength light-emitting device, according to an embodiment, an active layer emitting light of different colors may be monolithically formed. The active layer emitting light of a plurality of colors may be simply manufactured by locally controlling a porosity of the first type semiconductor layer.

Figure 6:
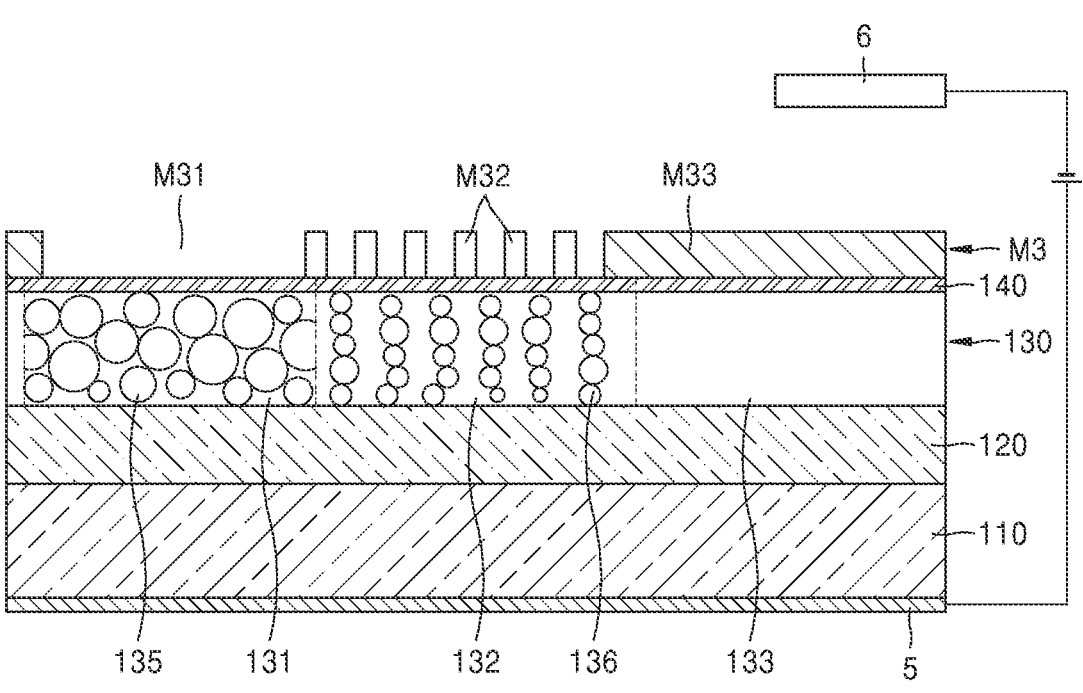
FIG. 6 is a diagram illustrating an example of a mask used in a method of manufacturing a multi-wavelength light-emitting device, according to an embodiment.

FIG. 6 is a diagram illustrating an example of a mask used in a method of manufacturing a multi-wavelength light-emitting device, according to an embodiment.

Referring back to FIG. 5A, the substrate 110, the first buffer layer 120, the first type semiconductor layer 130, and the second buffer layer 140 may be sequentially deposited. The first buffer layer 120 and the second buffer layer 140 may be optional. In addition, as shown in FIG. 6, a third mask M3 may be provided on the second buffer layer 140. The third mask M3 may include a first pattern M31 configured to open the first area 131, a second pattern M32 configured to partially open the second area 132, and a third pattern M33 configured to close the third area 133. The first pattern M31, the second pattern M32, and the third pattern M33 may have different open rates from one another. The open rate may indicate a ratio of an open area to an area of a corresponding mask. Although it is shown that the first pattern M31 is configured to completely open the first area 131, the first pattern M31 may also be configured to partially open the first area 131. Although it is shown that the third pattern M33 is configured to completely close the third area 133, the third pattern M33 may also be configured such that the third area 133 is partially opened. When an open rate of the first pattern M31 is OR1, an open rate of the second pattern M32 is OR2, and an open rate of the third pattern M33 is OR3, the third pattern M33 may satisfy a relationship (OR1>OR2>OR3). The second pattern M32 may include a lattice pattern or a stripe pattern.

By an electrochemical wet etching method using the third mask M3, the first nanopore 135 may be formed in the first area 131, and the second nanopore 136 may be formed in the second area 132. When the first nanopore 135 and the second nanopore 136 are formed, pore size or pore density may be adjusted by adjusting voltage, time, electrolyte, doping concentration, etc. Accordingly, the first porosity of the first nanopore 135 and the second porosity of the second nanopore 136 may be controlled. In the manufacturing method shown in FIG. 6, the first nanopore 135 and the second nanopore 136 may be simultaneously formed by using the third mask M3. Thus, the number of operations in manufacturing process may be reduced.

Figure 7A:
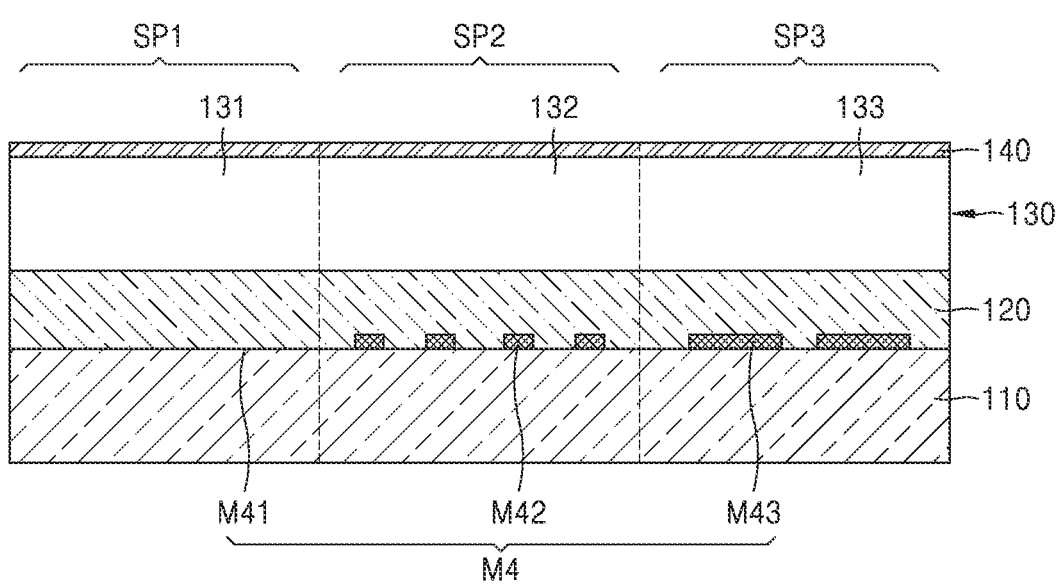
FIGS. 7A, 7B and 7C are diagrams illustrating a method of manufacturing a multi-wavelength light-emitting device, according to an embodiment.
Figure 7B:
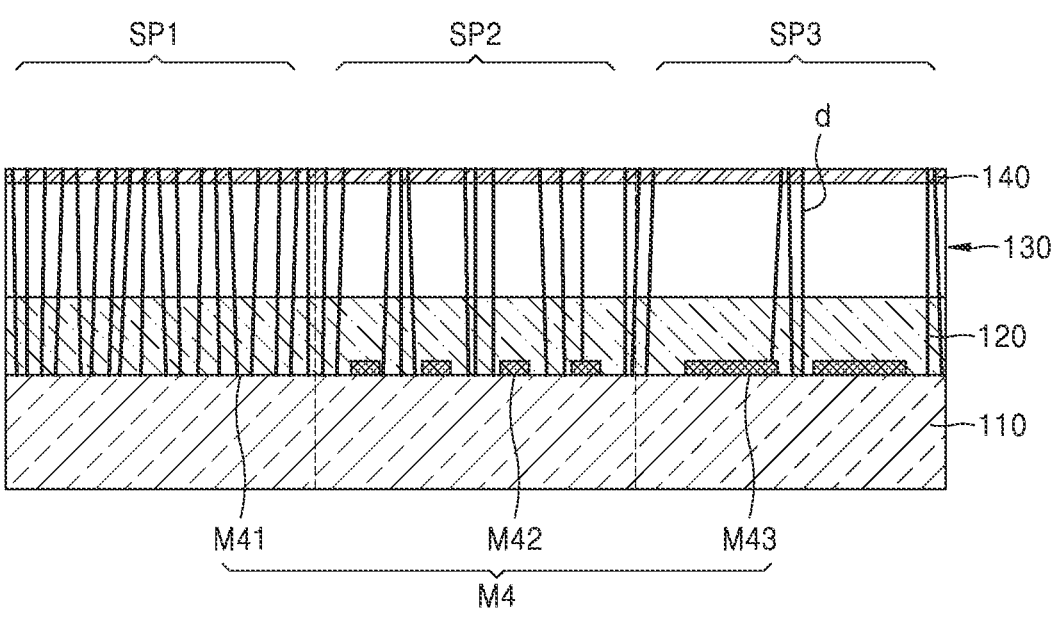
Figure 7C:
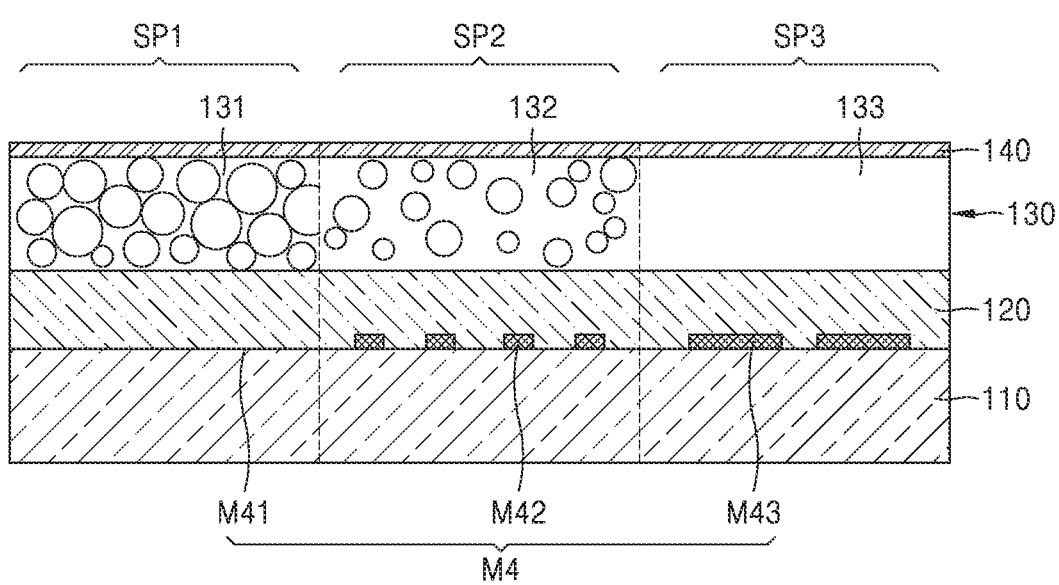

FIGS. 7A, 7B and 7C are diagrams illustrating a method of manufacturing a multi-wavelength light-emitting device, according to an embodiment.

Referring to FIG. 7A, a fourth mask M4 may be disposed on the substrate 110. The fourth mask M4 may include a first pattern M41 configured to open an area corresponding to the first sub-pixel SP1, a second pattern M42 configured to partially open an area corresponding to the second sub-pixel SP2, and a third pattern M43 configured to partially open an area corresponding to the third sub-pixel SP3.

The first pattern M41, the second pattern M42, and the third pattern M43 may have different open rates from one another. The open rate may indicate a ratio of an open area to an area of a corresponding mask. Although it is shown that the first pattern M41 is configured to completely open an area corresponding to the first sub-pixel SP1, the first pattern M41 may also be configured to partially open the area corresponding to the first sub-pixel SP1. When an open rate of the first pattern M41 is OR1, an open rate of the second pattern M42 is OR2, and an open rate of the third pattern M43 is OR3, the fourth mask M4 may satisfy a relationship (OR1>OR2>OR3). The first type semiconductor layer 130 may be deposited on the fourth mask M4. The first type semiconductor layer 130 may be further deposited before the first type semiconductor layer 130 is deposited. In addition, the second buffer layer 140 may be further deposited on the first type semiconductor layer 130.

Referring to FIG. 7B, because patterns of the fourth mask M4 are configured differently for each sub-pixel area, when the first type semiconductor layer 130 is deposited using the fourth mask M4, a dislocation density d of the first type semiconductor layer 130 may be configured differently for each area. When a dislocation density of an area corresponding to the first sub-pixel SP1 is d1, a dislocation density of an area corresponding to the second sub-pixel SP2 is d2, and a dislocation density of an area corresponding to the third sub-pixel SP3 is d3, the first type semiconductor layer 130 may have a relationship of (d1>d2>d3).

Referring to FIG. 7C, when an electrochemical wet etching process is used where dislocation densities of the first type semiconductor layer 130 are different from one another, the first nanopore 135 may be formed in the first area 131 of the first type semiconductor layer 130, and the second nanopore 136 may be formed in the second area 132, according to the dislocation densities. A porosity in an area having a relatively large dislocation density may be greater than a porosity in an area having a relatively small dislocation density. As described above, the electrochemical wet etching process may be reduced by first using the fourth mask M4 before the first type semiconductor layer 130 is formed.

FIGS. 8A, 8B, 8C, 8D and 8E are diagrams illustrating a method of manufacturing a multi-wavelength light-emitting device, according to an embodiment.

Figure 8A:
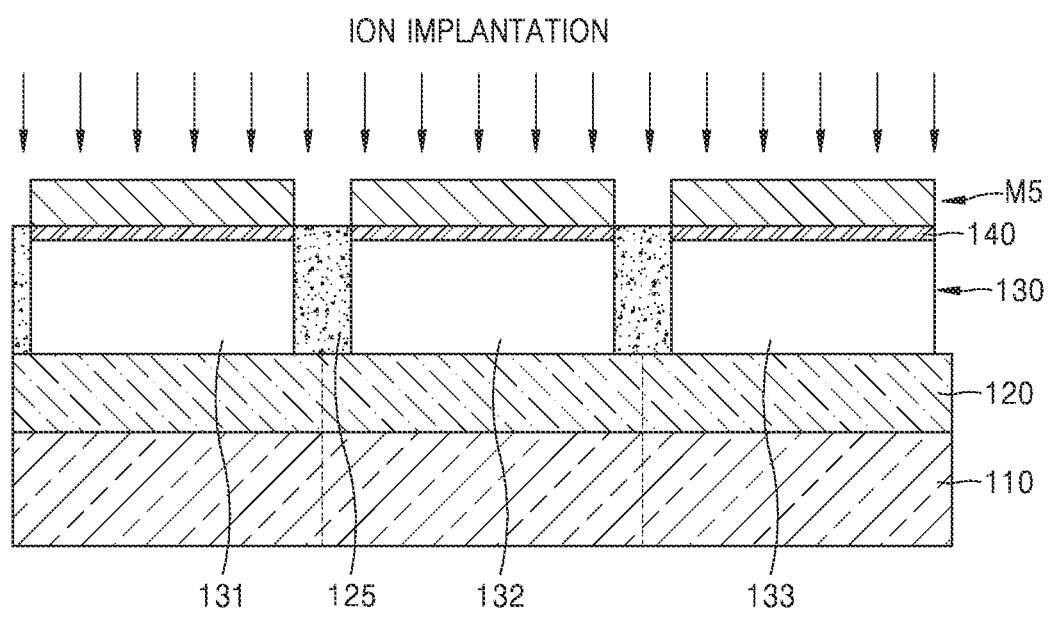
FIGS. 8A, 8B, 8C, 8D and 8E are diagrams illustrating a method of manufacturing a multi-wavelength light-emitting device, according to an embodiment.

Referring to FIG. 8A, the first type semiconductor layer 130 is deposited over the substrate 110. The first buffer layer 120 may be further deposited between the substrate 110 and the first type semiconductor layer 130. In addition, the second buffer layer 140 may be further deposited on the first type semiconductor layer 130. In addition, a fifth mask M5 may be provided on the second buffer layer 140. The fifth mask M5 may be configured to open an area between the first sub-pixel SP1 and the second sub-pixel SP2 and an area between the second sub-pixel SP2 and the third sub-pixel SP3. A separation portion 125 may be formed in the first type semiconductor layer 130 by performing an ion implantation using the fifth mask M5. The separation portion 125 may prevent the first type semiconductor layer 130 from being laterally wetted and affecting neighboring areas when the first type semiconductor layer 130 is wet-etched. The first type semiconductor layer 130 may be divided into the first area 131, the second area 132, and the third area 133 by the separation portion 125.

Figure 8B:
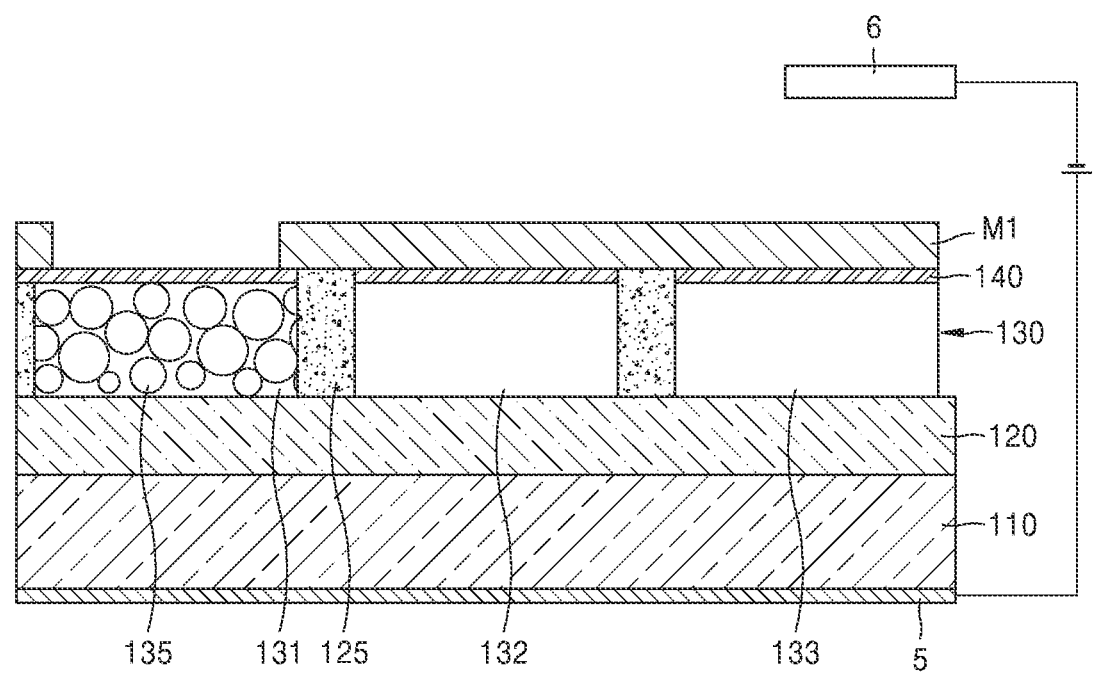

Referring to FIG. 8B, the first mask M1 may be provided on the second buffer layer 140. The first mask M1 may be configured to open the first area 131 and close the second area 132 and the third area 133. When the first mask M1 is etched by the first mask M1 using the electrochemical wet etching method, the first nanopore 135 may be formed to have the first porosity in the first area 131 of the first type semiconductor layer 130.

Figure 8C:
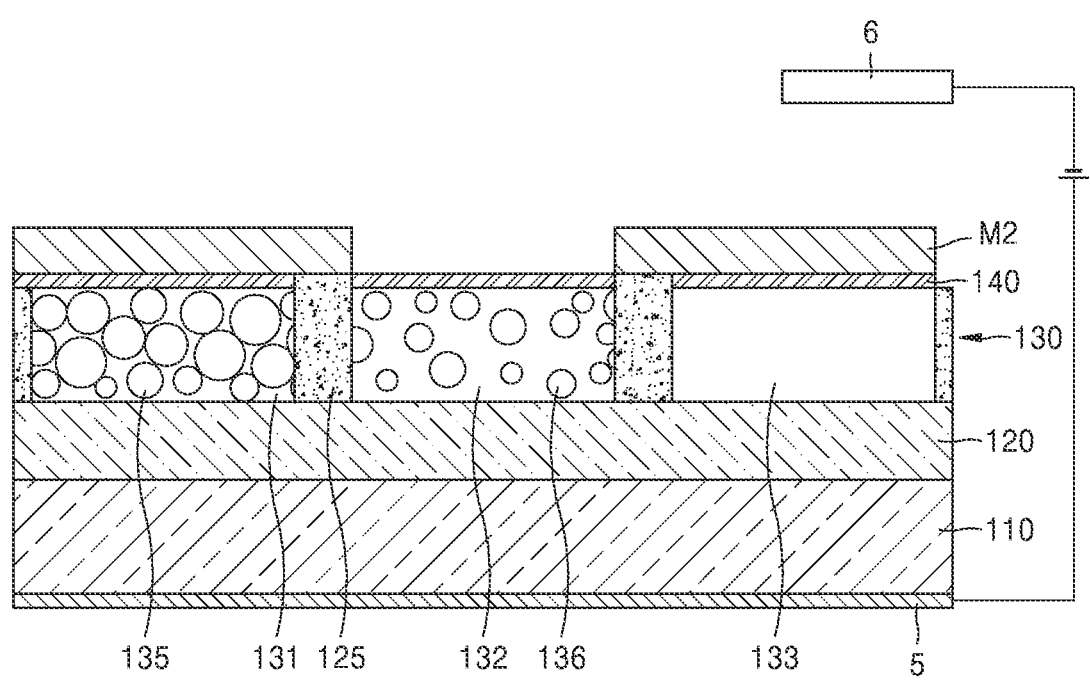

Referring to FIG. 8C, the first mask M1 may be removed, and the second mask M2 may be disposed over the first type semiconductor layer 130. The second mask M2 may be configured to open the second area 132 of the first type semiconductor layer 130 and close the first area 131 and the third area 133. The second nanopore 136 may be formed in the second area 132 by the electrochemical wet etching method using the second mask M2. The first type semiconductor layer 130 may be formed such that the first porosity is greater than the second porosity. The separation portion 125 may block the first nanopore 135 and the second nanopore 136 from affecting neighboring areas when the first nanopore 135 and the second nanopore 136 are formed.

Figure 8D:
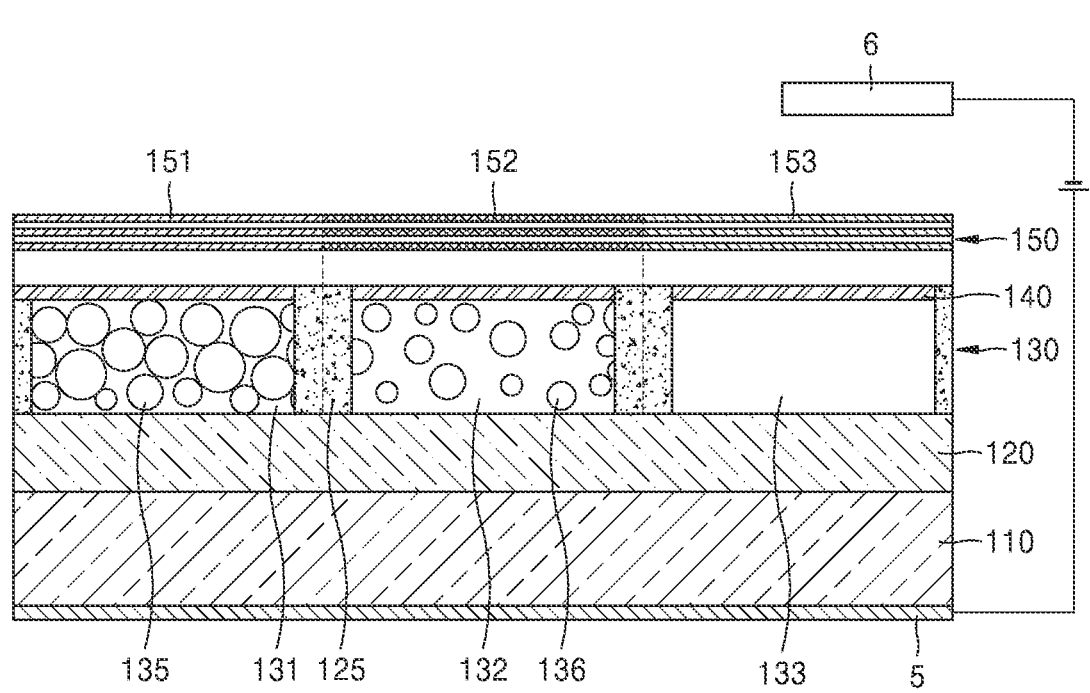

Referring to FIG. 8D, the second mask M2 may be removed, and the active layer 150 may be deposited on the second buffer layer 140. The active layer 150 may include the first active area 151 emitting the light of the first wavelength, the second active area 152 emitting the light of the second wavelength, and the third active area 153 emitting the light of the third wavelength, according to different porosity of the first area 131, the second area 132, and the third area 133 of the first type semiconductor layer 130.

Figure 8E:
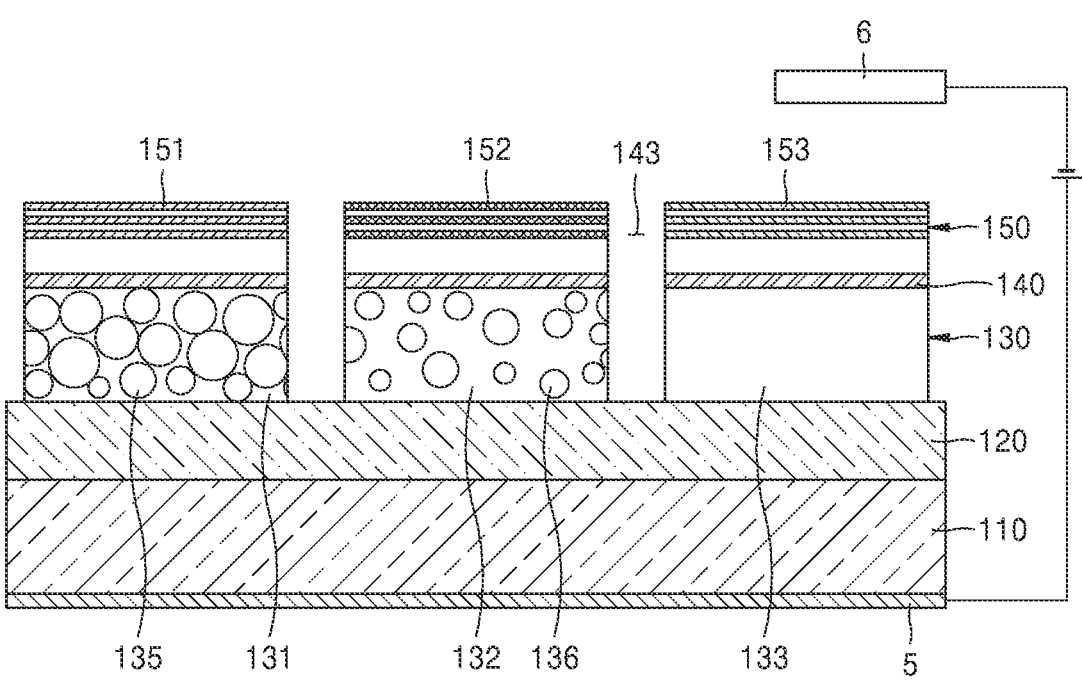

Referring to FIG. 8E, a trench 143 may be formed between the first area 131 and the second area 132 and between the second area 132 and the third area 133. The trench 143 may be formed to pass through the active layer 150, the second buffer layer 140, and the first type semiconductor layer 130. The trench 143 may separate a pixel in units of sub-pixels.

As described above, in the method of manufacturing the multi-wavelength light-emitting device, according to an embodiment, an active layer emitting light of a plurality of colors may be monolithically manufactured. Because a single first type semiconductor layer includes areas having different porosity, strain may be locally controlled, and according to the porosity, a composition ratio of a material for controlling a wavelength included in the active layer grown on the first type semiconductor layer, for example, a composition ratio of In, may be controlled.

Because the multi-wavelength light-emitting device according to an embodiment has a monolithic structure, a bonding layer is not present between each layer, and a color conversion layer including quantum dots or phosphor is not necessary.

The multi-wavelength light-emitting device according to an embodiment is an inorganic self-luminous material and may be applied to large-sized televisions (TV) and small displays. The multi-wavelength light-emitting device may be manufactured as a micro LED having a size less than or equal to 100 um.

Figure 9:
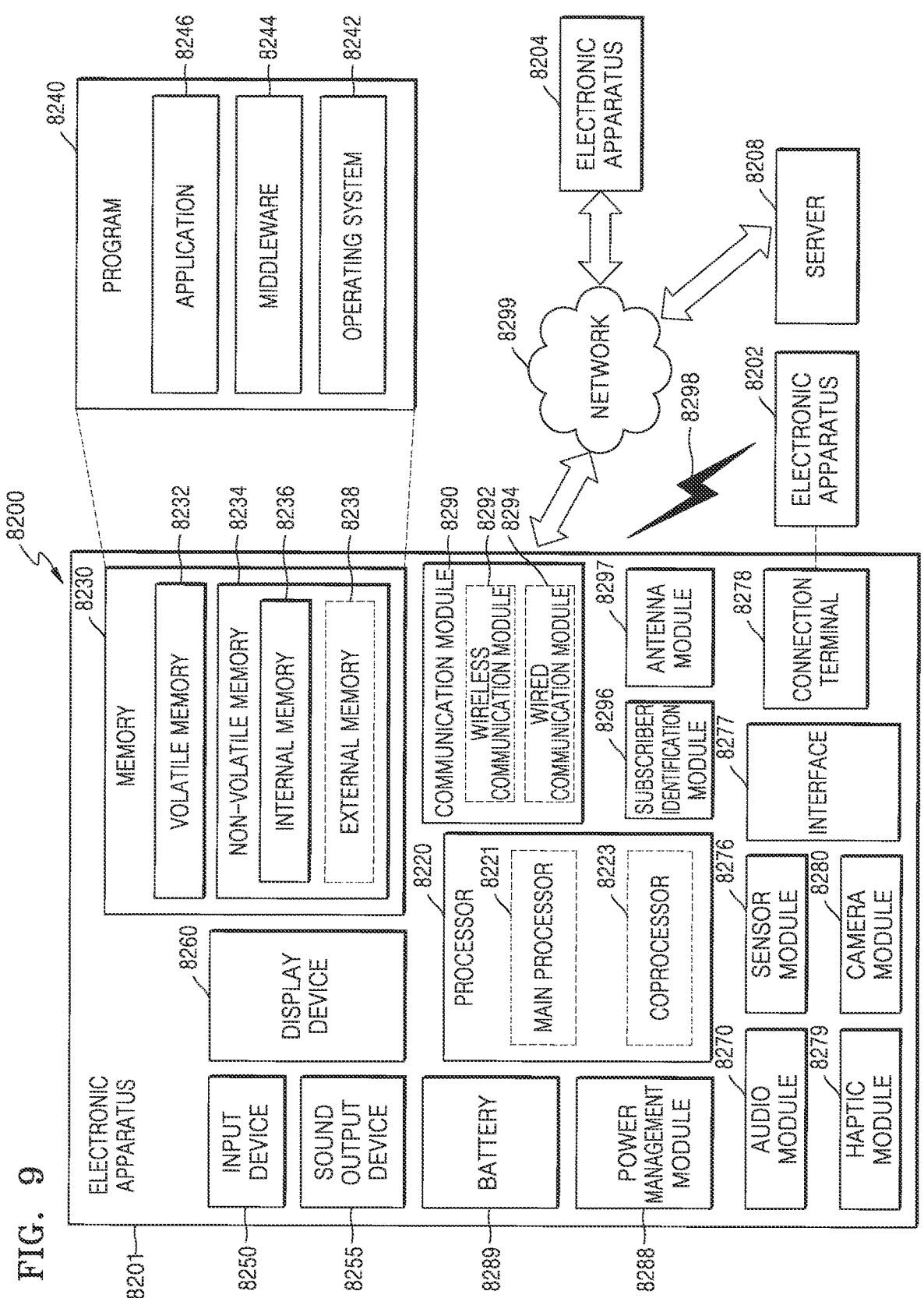
FIG. 9 is a diagram illustrating an electronic apparatus according to an embodiment.

FIG. 9 is a diagram illustrating an electronic apparatus according to an embodiment.

Referring to FIG. 9, the electronic apparatus 8201 may be provided in a network environment 8200. In the network environment 8200, the electronic apparatus 8201 may communicate with another electronic apparatus 8202 through a first network 8298 (for example, a near-field wireless communication network) or may communicate with another electronic apparatus 8204 and/or a server 8208 through a second network 8299 (for example, a long-range wireless communication network or the like). The electronic apparatus 8201 may communicate with the electronic apparatus 8204 through the server 8208. The electronic apparatus 8201 may include a processor 8220, a memory 8230, an input device 8250, a sound output device 8255, the display device 8260, an audio module 8270, a sensor module 8276, an interface 8277, a haptic module 8279, a camera module 8280, a power management module 8288, a battery 8289, a communication module 8290, a subscriber identification module 8296, and/or an antenna module 8297. In the electronic apparatus 8201, some of these elements may be omitted or other elements may be added. Some of the elements may be implemented as one integrated circuit. For example, the sensor module 8276 (for example, a fingerprint sensor, an iris sensor, an illuminance sensor, etc.) may be implemented by being embedded in the display device 8260 (for example, a display, etc.).

The processor 8220 may execute software (for example, a program 8240, etc.) and control one or more other elements (for example, hardware and software elements, etc.) of the electronic apparatus 8201 connected to the processor 8220, and perform various data processing or operations. As part of the data processing or operations, the processor 8220 may load, into a volatile memory 8232, a command and/or data received from other elements (for example, the sensor module 8276, the communication module 8290, etc.), process the command and/or data stored in the volatile memory 8232, and store resulting data in a non-volatile memory 8234. The non-volatile memory 8234 may include an internal memory 8236 and an external memory 8238. The processor 8220 may include a main processor 8221 (for example, a central processing unit, an application processor, etc.) and an auxiliary processor 8223 (for example, a graphics processing device, an image signal processor, a sensor hub processor, a communication processor, etc.) that may be operated independently or together with the main processor 8221. The auxiliary processor 8223 may use less power than the main processor 8221 and may perform a specialized function.

The auxiliary processor 8223 may control a function and/or a state related to some elements (for example, the display device 8260, the sensor module 8276, the communication module 8290, etc.) from among the elements of the electronic apparatus 8201 on behalf of the main processor 8221 while the main processor 8221 is in an inactive state (sleep state), or together with the main processor 8221 while the main processor 8221 is in an active state (application execution state). The auxiliary processor 8223 (for example, an image signal processor, a communication processor, etc.) may be implemented as part of other elements (the camera module 8280, the communication module 8290, etc.) functionally related thereto.

The memory 8230 may store various pieces of data that elements (for example, the processor 8220, a sensor module 8276, etc.) of the electronic apparatus 8201 use. For example, the data may include input data and/or output data for software (for example, the program 8240, etc.) and commands associated therewith. The memory 8230 may include the volatile memory 8232 and/or the non-volatile memory 8234.

The program 8240 may be stored as software in the memory 8230, and may include an operating system 8242, middleware 8244, and/or an application 8246.

The input device 8250 may receive, from the outside (for example, a user) of the electronic apparatus 8201, a command and/or data to be used in an element (for example, the processor 8220) of the electronic apparatus 8201. The input device 8250 may include a remote controller, a microphone, a mouse, a keyboard, and/or a digital pen (for example, a stylus pen).

The sound output device 8255 may output an acoustic signal to the outside of the electronic apparatus 8201. The sound output device 8255 may include a speaker and/or a receiver. The speaker may be used for general purposes, such as multimedia playback or recording playback, and the receiver may be used to receive incoming calls. The receiver may be integrated as part of the speaker or may be implemented as an independent separate device.

The display device 8260 may visually provide information to the outside of the electronic apparatus 8201. The display device 8260 may include a display, a hologram device, a projector, or a projector, and a control circuit for controlling the corresponding device. The display device 8260 may include a display device to which the multi-wavelength light-emitting device described with reference to FIGS. 1 to 8E is applied. The display device 8260 may include a touch circuitry configured to detect a touch, and/or a sensor circuit (for example, a pressure sensor, etc.) configured to measure an intensity of a force generated by the touch.

The audio module 8270 may convert a sound into an electric signal or, conversely, convert an electric signal into a sound. The audio module 8270 may obtain a sound through the input device 8250 or may output a sound through a speaker and/or a headphone of the sound output device 8255 and/or another electronic apparatus (for example, the electronic apparatus 8202, etc.) directly or wirelessly connected to the electronic apparatus 8201.

The sensor module 8276 may detect an operating state (for example, power and a temperature) of the electronic apparatus 8201 or an external environment state (for example, a state of a user), and generate an electric signal and/or data value corresponding to the detected state. The sensor module 8276 may include a gesture sensor, a gyroscope sensor, a barometric pressure sensor, a magnetic sensor, an acceleration sensor, a grip sensor, a proximity sensor, a color sensor, an infrared (IR) sensor, a biometric sensor, a temperature sensor, a humidity sensor, and/or an illumination sensor.

The interface 8277 may support one or more designated protocols that may be used to directly or wirelessly connect the electronic apparatus 8201 to another electronic apparatus (for example, the electronic apparatus 8202, etc.). The interface 8277 may include a high definition multimedia interface (HMDI), a universal serial bus (USB) interface, a secure digital (SD) card interface, and/or an audio interface.

A connection terminal 8278 may include a connector through which the electronic apparatus 8201 may be physically connected to another electronic apparatus (for example, the electronic apparatus 8202, etc.). The connection terminal 8278 may include an HDMI connector, a USB connector, an SD card connector, and/or an audio connector (for example, a headphone connector, etc.).

The haptic module 8279 may convert an electrical signal into a mechanical stimulus (for example, vibration and movement) or an electrical stimulus that a user may recognize through tactile or kinesthetic sense. The haptic module 8279 may include a motor, a piezoelectric element, and/or an electrical stimulation device.

The camera module 8280 may capture a still image and a moving image. The camera module 8280 may include a lens assembly, image sensors, image signal processors, and/or flashes, the lens assembly including one or more lens. The lens assembly included in the camera module 8280 may collect light emitted from a subject to be imaged.

The power management module 8288 may manage power supplied to the electronic apparatus 8201. The power management module 8288 may be implemented as part of a power management integrated circuit (PMIC).

The battery 8289 may supply power to elements of the electronic apparatus 8201. The battery 8289 may include a non-rechargeable primary cell, a rechargeable secondary cell, and/or a fuel cell.

The communication module 8290 may support establishment of a communication channel and/or a wireless communication channel between the electronic apparatus 8201 and another electronic apparatus (for example, the electronic apparatus 8202, the electronic apparatus 8204, the server 8208, etc.), and support communication through the established communication channel. The communication module 8290 may include one or more communication processors, which operate independently of the processor 8220 (for example, an application processor, etc.) and support direct communication and/or wireless communication. The communication module 8290 may include a wireless communication module 8292 (for example, a cellular communication module, a near-field wireless communication module, a global navigation satellite system (GNSS), etc.) or a wired communication module 8294 (for example, a local area network (LAN) communication module, a power line communication module, etc.). A corresponding communication module from among these communication modules may communicate with another electronic apparatus through the first network 8298 (for example, a near-field communication network, such as Bluetooth, Wi-Fi Direct, or Infrared Data Association (IrDA)) or the second network 8299 (for example, a long-range communication network, such as a cellular network, the Internet, or a computer network, such as a LAN and a wide area network (WAN)). The various types of communication modules described above may be integrated into a single element (for example, a single chip) or may be implemented as a plurality of separate elements (for example, a plurality of chips). The wireless communication module 8292 may verify and authenticate the electronic apparatus 8201 within a communication network, such as the first network 8298 and/or the second network 8299, by using subscriber information (for example, the international mobile subscriber identity (IMSI), etc.) stored in the subscriber identification module 8296.

The antenna module 8297 may transmit or receive a signal and/or power to or from the outside (for example, another electronic apparatus, etc.). An antenna may include a radiator having a conductive pattern formed on a substrate (for example, a printed circuit board (PCB), etc.). The antenna module 8297 may include one or more antennas. When the plurality of antennas are included, an antenna suitable for a communication scheme used in a communication network, such as the first network 8298 and/or the second network 8299, may be selected from among the plurality of antennas by the communication module 8290. Through the selected antenna, a signal and/or power may be transmitted or received between the communication module 8290 and the other electronic apparatus. In addition to the antenna, other elements (for example, a radio-frequency integrated circuit (RFIC), etc.) may be included as part of the antenna module 8297.

Some of the elements may be connected to each other through a communication scheme between peripheral devices (for example, a bus, a general purpose input and output (GPIO), a serial peripheral interface (SPI), a mobile industry processor interface (MIPI), etc.) and exchange signals (for example, commands, data, etc.).

The commands or data may be transmitted or received between the electronic apparatus 8201 and the external electronic apparatus 8204 through the server 8208 connected to the second network 8299. The other electronic apparatuses 8202 and 8204 may be apparatuses of the same or different types as or from the electronic apparatus 8201. All or part of operations executed in the electronic apparatus 8201 may be executed in one or more apparatuses from among the other electronic apparatuses 8202, 8204, and 8208. For example, when the electronic apparatus 8201 is to perform a function or service, the electronic apparatus 8201 may request one or more other electronic apparatuses to perform all or part of the function or service instead of executing the function or service by itself. The one or more other electronic apparatuses receiving the request may execute an additional function or service related to the request and transfer a result of the execution to the electronic apparatus 8201. To this end, cloud computing, distributed computing, and/or client-server computing technologies may be used.

Figure 10:
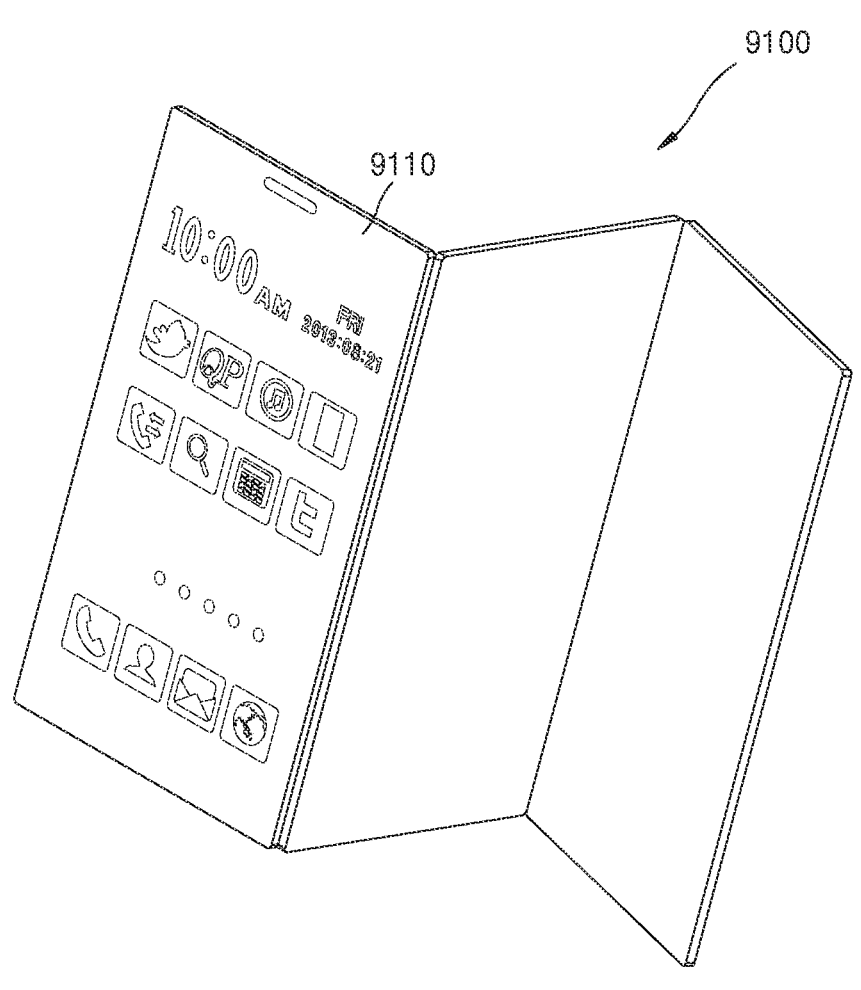
FIG. 10 is a diagram illustrating an example in which the multi-wavelength light-emitting device is applied to a mobile device according to an embodiment.

FIG. 10 is a diagram illustrating an example in which the multi-wavelength light-emitting device is applied to a mobile device according to an embodiment. The mobile device 9100 may include a display device 9110, and the display device 9110 may include display devices to which the multi-wavelength light-emitting device described with reference to FIGS. 1 to 8E is applied. The display device 9110 may have a foldable structure, for example, a multi-foldable structure.

Figure 11:
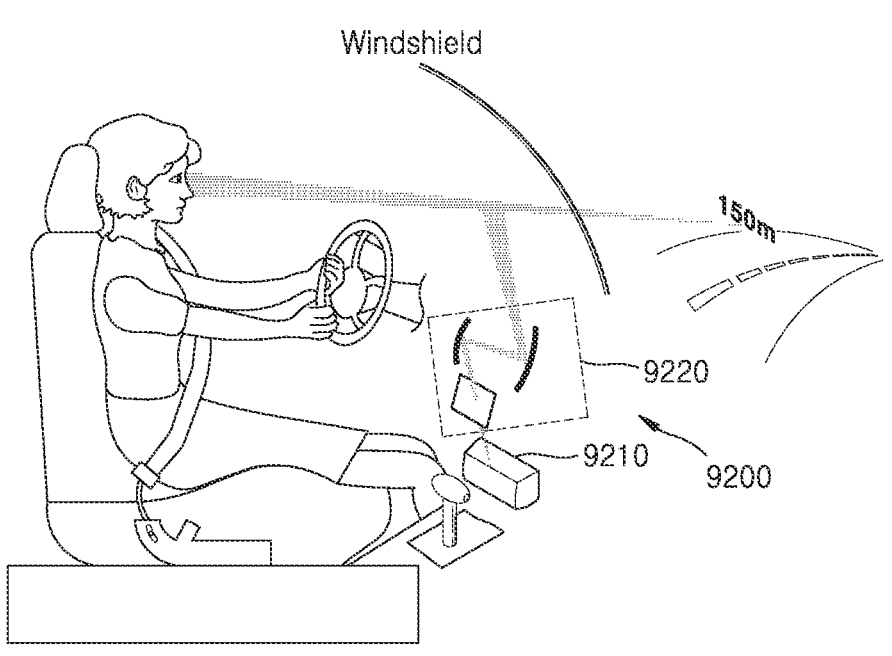
FIG. 11 is a diagram illustrating an example in which the multi-wavelength light-emitting device is applied to a display device for a vehicle according to an embodiment.

FIG. 11 is a diagram illustrating an example in which the multi-wavelength light-emitting device is applied to a display device for a vehicle according to an embodiment. The display device may be a head-up display device 9200 for a vehicle, and may include a display 9210 provided in one area of the vehicle, and an optical path changing member 9220 that converts a light path so that the driver may see an image generated by the display 9210.

Figure 12:
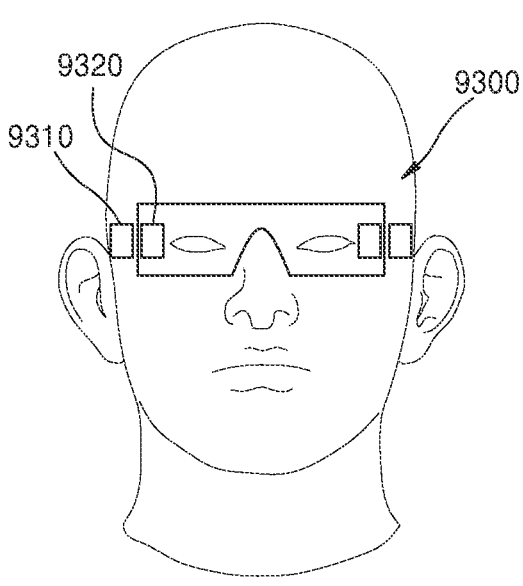
FIG. 12 is a diagram illustrating an example in which the multi-wavelength light-emitting device is applied to augmented reality glasses according to an embodiment.

FIG. 12 is a diagram illustrating an example in which the multi-wavelength light-emitting device is applied to augmented reality glasses according to an embodiment. The augmented reality glasses 9300 may include a projection system 9310 that forms an image, and an element 9320 that guides the image from the projection system 9310 into an eye of the user. The projection system 9310 may include the multi-wavelength light-emitting device described with reference to FIGS. 1 to 8E.

Figure 13:
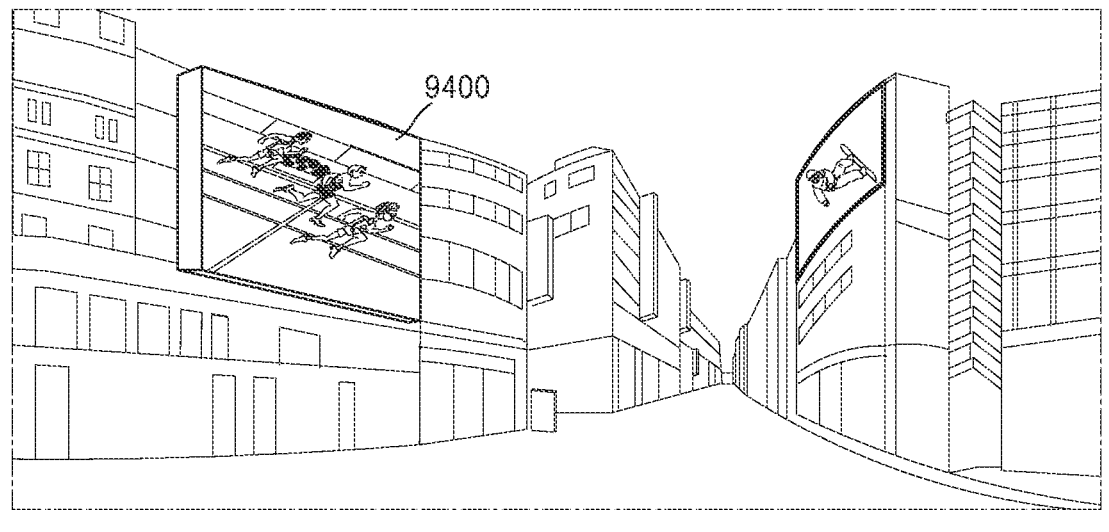
FIG. 13 is a diagram illustrating an example in which the multi-wavelength light-emitting device is applied to a signage according to an embodiment.

FIG. 13 is a diagram illustrating an example in which the multi-wavelength light-emitting device is applied to a signage according to an embodiment. The signage 9400 may be used for outdoor advertisement using a digital information display and may control advertisement content, etc. through a communication network. For example, the signage 9400 may be implemented through the electronic apparatus described with reference to FIG. 9.

Figure 14:
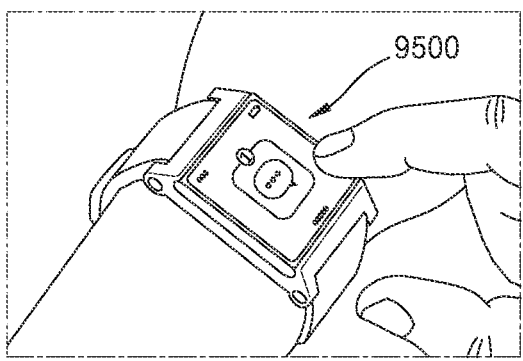
FIG. 14 is a diagram illustrating an example in which the multi-wavelength light-emitting device is applied to a wearable display according to an embodiment.

FIG. 14 is a diagram illustrating an example in which the multi-wavelength light-emitting device is applied to a wearable display according to an embodiment. The wearable display 9500 may include the multi-wavelength light-emitting device described with reference to FIGS. 1 to 8E, and may be implemented through the electronic apparatus described with reference to FIG. 9.

The display device according to an embodiment may be applied to various products, such as rollable TV or stretchable displays, in addition to the above.

The multi-wavelength light-emitting device according to an embodiment includes a first type semiconductor layer having different porosity from each other so that strain may be locally controlled according to the porosity. Accordingly, an active layer grown on the first type semiconductor layer may emit light of a plurality of colors.

In the method of manufacturing the multi-wavelength light-emitting device, according to an embodiment, a plurality of areas having different porosity from each other are formed in the first type semiconductor layer, and an active layer is deposited on the first type semiconductor layer such that the areas emit light of a plurality of colors. In the method of manufacturing the multi-wavelength light-emitting device, according to an embodiment, the areas emitting light of a plurality of colors may be monolithically manufactured.

Further provided is a micro-LED device having R/G/B wavelengths (or multiple wavelengths), in which electrochemical variables (e.g., voltage, time, electrolyte, etc.) are controlled or a wet etching mask is adjusted in a wet etching process of a doping layer to locally select and control porosity within the same layer, such that the In compositions are locally different when an optical emission layer (e.g., active layer, Quantum Well) is simultaneously grown on the doping layer.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A method of manufacturing a multi-wavelength light-emitting device comprising a first sub-pixel configured to emit light of a first wavelength, a second sub-pixel configured to emit light of a second wavelength, and a third sub-pixel configured to emit light of a third wavelength, the method comprising:

depositing a first type semiconductor layer on a substrate;

forming a first nanopore having a first porosity in a first area of the first type semiconductor layer corresponding to the first sub-pixel;

forming a second nanopore having a second porosity in a second area of the first type semiconductor layer corresponding to the second sub-pixel, the second porosity being different from the first porosity;

depositing an active layer on the first type semiconductor layer;

forming a second type semiconductor layer on the active layer; and forming an electrode on the second type semiconductor layer, wherein the forming the first nanopore and the second nanopore comprises forming the first nanopore and the second nanopore by an electrochemical wet etching method using a mask that sequentially opens the first area and the second area over time or using a mask that opens the first area and partially opens the second area.

2. The method of claim 1, wherein the forming the first nanopore and the second nanopore comprises forming the first nanopore and the second nanopore by the electrochemical wet etching method using the mask configured to open the first area and partially open the second area, and wherein the mask that is configured to open the first area and partially open the second area is further configured to close a third area of the first type semiconductor layer corresponding to the third sub-pixel.

3. The method of claim 1, further comprising forming a first current blocking layer between the first sub-pixel and the second sub-pixel, and forming a second current blocking layer between the second sub-pixel and the third sub-pixel.

4. The method of claim 1, wherein the first porosity is greater than the second porosity, wherein the light of the first wavelength comprises red light, and wherein the light of the second wavelength comprises green light.

5. The method of claim 1, wherein the first porosity is adjusted by at least one of a size and a density of the first nanopore, and wherein the second porosity is adjusted by at least one of a size and a density of the second nanopore.

6. The method of claim 1, wherein the first porosity is in a range of about 20% to about 70%.

7. The method of claim 1, wherein a diameter of the first nanopore is in a range of about 30 nm to about 200 nm.

8. The method of claim 1, wherein the first type semiconductor layer comprises an n-type gallium nitride (GaN), and wherein the second type semiconductor layer comprises a p-type GaN.

9. The method of claim 1, wherein the active layer comprises indium gallium nitride (InGaN) or aluminum indium gallium nitride (AlInGaN).

10. A method of manufacturing a multi-wavelength light-emitting device comprising a first sub-pixel configured to emit light of a first wavelength, a second sub-pixel configured to emit light of a second wavelength, and a third sub-pixel configured to emit light of a third wavelength, the method comprising:

depositing a first type semiconductor layer on a substrate;

forming a first nanopore having a first porosity in a first area of the first type semiconductor layer corresponding to the first sub-pixel;

forming a second nanopore having a second porosity in a second area of the first type semiconductor layer corresponding to the second sub-pixel, the second porosity being different from the first porosity;

depositing an active layer on the first type semiconductor layer;

forming a second type semiconductor layer on the active layer; and forming an electrode on the second type semiconductor layer, wherein the forming the first nanopore comprises:

arranging a first mask on the first type semiconductor layer, the first mask configured to open the first area of the first type semiconductor layer and close the second area of the first type semiconductor layer and a third area of the first type semiconductor layer; and forming the first nanopore in the first area of the first type semiconductor layer by an electrochemical wet etching method using the first mask.

11. The method of claim 10, wherein the forming the second nanopore comprises:

after removing the first mask, arranging a second mask on the first type semiconductor layer, the second mask being configured to close the first area of the first type semiconductor layer and the third area of the first type semiconductor layer, and open the second area of the first type semiconductor layer; and forming the second nanopore in the second area of the first type semiconductor layer by an electrochemical etching method using the second mask.

12. A method of manufacturing a multi-wavelength light-emitting device comprising a first sub-pixel configured to emit light of a first wavelength, a second sub-pixel configured to emit light of a second wavelength, and a third sub-pixel configured to emit light of a third wavelength, the method comprising:

depositing a first type semiconductor layer on a substrate;

forming a first nanopore having a first porosity in a first area of the first type semiconductor layer corresponding to the first sub-pixel;

forming a second nanopore having a second porosity in a second area of the first type semiconductor layer corresponding to the second sub-pixel, the second porosity being different from the first porosity;

depositing an active layer on the first type semiconductor layer;

forming a second type semiconductor layer on the active layer; and forming an electrode on the second type semiconductor layer, wherein the method further comprises:

forming a first ion implantation area between the first area of the first type semiconductor layer and the second area of the first type semiconductor layer, and forming a second ion implantation area between the second area of the first type semiconductor layer and a third area of the first type semiconductor layer.

* * * * *